(12) United States Patent
Linstadt et al.

(10) Patent No.: US 11,636,915 B2
(45) Date of Patent: Apr. 25, 2023

(54) COMMAND/ADDRESS CHANNEL ERROR DETECTION

(71) Applicant: Rambus Inc., San Jose, CA (US)

(72) Inventors: John Eric Linstadt, Palo Alto, CA (US); Frederick A. Ware, Los Altos Hills, CA (US)

(73) Assignee: Rambus Inc., San Jose, CA (US)

( * ) Notice: Subject to any disclaimer, the term of this patent is extended or adjusted under 35 U.S.C. 154(b) by 0 days.

(21) Appl. No.: 17/746,674

(22) Filed: May 17, 2022

(65) Prior Publication Data

US 2022/0343992 A1   Oct. 27, 2022

Related U.S. Application Data

(63) Continuation of application No. 17/049,282, filed as application No. PCT/US2019/023236 on Mar. 20, 2019, now Pat. No. 11,361,839.

(60) Provisional application No. 62/711,541, filed on Jul. 29, 2018, provisional application No. 62/648,340, filed on Mar. 26, 2018.

(51) Int. Cl.
*G11C 29/42* (2006.01)
*G11C 8/18* (2006.01)
*G11C 29/18* (2006.01)
*G11C 29/44* (2006.01)

(52) U.S. Cl.
CPC ............ *G11C 29/42* (2013.01); *G11C 8/18* (2013.01); *G11C 29/18* (2013.01); *G11C 29/44* (2013.01)

(58) Field of Classification Search
CPC .......... G11C 29/42; G11C 8/18; G11C 29/18; G11C 29/44
See application file for complete search history.

(56) References Cited

U.S. PATENT DOCUMENTS

| 3,585,378 A | 5/1971 | Bouricius et al. |
| 3,893,072 A | 7/1975 | D'Antonio et al. |
| 4,054,911 A | 10/1977 | Fletcher et al. |

(Continued)

FOREIGN PATENT DOCUMENTS

WO   WO-2012-074724 A1   6/2012

OTHER PUBLICATIONS

Answers.com, "ECC Memory," http//www.answers.com/topic/eec-memory, obtained Jun. 20. 2006. 2 pages.

(Continued)

*Primary Examiner* — Tuan T Nguyen
(74) *Attorney, Agent, or Firm* — The Neudeck Law Firm, LLC

(57) ABSTRACT

A memory component and a controller communicate commands and data with each other The commands to activate and then access data, and the data itself, are all communicated between a controller and the memory component at different times. The controller and memory component each calculate a respective error detecting code (EDC) values on the activate command information (e.g., bank address and row address) and store them indexed by the bank address. When the memory component is accessed, retrieved EDC values are combined with EDC values calculated from the access command information, and the data itself. The memory component transmits its combined EDC value to the controller for checking.

20 Claims, 18 Drawing Sheets

(56) References Cited

U.S. PATENT DOCUMENTS

| | | |
|---|---|---|
| 4,162,536 A | 7/1979 | Morley |
| 4,354,225 A | 10/1982 | Frieder et al. |
| 4,359,771 A | 11/1982 | Johnson et al. |
| 4,363,125 A | 12/1982 | Brewer et al. |
| 4,369,510 A | 1/1983 | Johnson et al. |
| 4,394,763 A | 7/1983 | Nagano et al. |
| 4,456,993 A | 6/1984 | Taniguchi et al. |
| 4,468,731 A | 8/1984 | Johnson et al. |
| 4,527,237 A | 7/1985 | Frieder et al. |
| 4,535,455 A | 8/1985 | Peterson |
| 4,543,628 A | 9/1985 | Pomfret |
| 4,584,685 A | 4/1986 | Gajjar |
| 4,596,014 A | 6/1986 | Holeman |
| 4,597,084 A | 6/1986 | Dynneson et al. |
| 4,604,750 A | 8/1986 | Manton et al. |
| 4,648,064 A | 3/1987 | Morley |
| 4,792,923 A | 12/1988 | Nakase et al. |
| 4,888,773 A | 12/1989 | Arlington et al. |
| 4,914,657 A | 4/1990 | Walter et al. |
| 4,920,539 A | 4/1990 | Albonesi |
| 4,924,456 A | 5/1990 | Maxwell et al. |
| 4,970,714 A | 11/1990 | Chen et al. |
| 5,065,312 A | 11/1991 | Bruckert et al. |
| 5,070,474 A | 12/1991 | Tuma et al. |
| 5,173,905 A | 12/1992 | Parkinson et al. |
| 5,218,691 A | 6/1993 | Tuma et al. |
| 5,313,627 A | 5/1994 | Amini et al. |
| 5,341,251 A | 8/1994 | Fincher et al. |
| 5,347,643 A | 9/1994 | Kondo et al. |
| 5,392,302 A | 2/1995 | Kemp et al. |
| 5,404,361 A | 4/1995 | Casorso et al. |
| 5,450,609 A | 9/1995 | Schultz et al. |
| 5,488,691 A | 1/1996 | Fuoco et al. |
| 5,490,153 A | 2/1996 | Gregg et al. |
| 5,502,733 A | 3/1996 | Kishi et al. |
| 5,550,988 A | 8/1996 | Sarangdhar et al. |
| 5,553,231 A | 9/1996 | Papenberg et al. |
| 5,559,956 A | 9/1996 | Sukegawa |
| 5,588,112 A | 12/1996 | Dearth et al. |
| 5,687,183 A | 11/1997 | Chesley |
| 5,729,550 A | 3/1998 | Nakajima et al. |
| 5,751,932 A | 5/1998 | Horst et al. |
| 5,751,955 A | 5/1998 | Sonnier et al. |
| 5,778,419 A | 7/1998 | Hansen et al. |
| 5,828,677 A | 10/1998 | Sayeed et al. |
| 5,841,795 A | 11/1998 | Olarig et al. |
| 5,987,628 A | 11/1999 | Von Bokern et al. |
| 6,003,151 A | 12/1999 | Chuang |
| 6,009,542 A | 12/1999 | Koller et al. |
| 6,012,136 A | 1/2000 | Brown |
| 6,038,679 A | 3/2000 | Hanson |
| 6,065,146 A | 5/2000 | Bosshart |
| 6,081,145 A | 6/2000 | Bandai et al. |
| 6,094,732 A | 7/2000 | Takano |
| 6,115,763 A | 9/2000 | Douskey |
| 6,125,470 A | 9/2000 | Hee et al. |
| 6,151,689 A | 11/2000 | Garcia et al. |
| 6,169,710 B1 | 1/2001 | Arai |
| 6,189,123 B1 | 2/2001 | Anders Nystrom et al. |
| 6,208,663 B1 | 3/2001 | Schramm et al. |
| 6,212,660 B1 | 4/2001 | Joeressen et al. |
| 6,249,894 B1 | 6/2001 | Lin et al. |
| 6,308,294 B1 | 10/2001 | Ghosh et al. |
| 6,314,541 B1 | 11/2001 | Seytter et al. |
| 6,367,048 B1 | 4/2002 | McAuliffe et al. |
| 6,373,842 B1 | 4/2002 | Coverdale et al. |
| 6,393,504 B1 | 5/2002 | Leung et al. |
| 6,397,365 B1 | 5/2002 | Brewer et al. |
| 6,438,723 B1 | 8/2002 | Kalliojarvi |
| 6,507,928 B1 | 1/2003 | Richardson |
| 6,529,561 B2 | 3/2003 | Sipola |
| 6,545,994 B2 | 4/2003 | Nelson et al. |
| 6,553,003 B1 | 4/2003 | Chang |
| 6,560,725 B1 | 5/2003 | Longwell et al. |
| 6,606,589 B1 | 8/2003 | Tuma et al. |
| 6,625,749 B1 | 9/2003 | Quach |
| 6,646,911 B2 | 11/2003 | Hidaka |
| 6,697,986 B2 | 2/2004 | Kim et al. |
| 6,700,867 B2 | 3/2004 | Classon et al. |
| 6,704,898 B1 | 3/2004 | Furuskar et al. |
| 6,715,116 B2 | 3/2004 | Lester et al. |
| 6,725,414 B2 | 4/2004 | Seyyedy |
| 6,735,726 B2 | 5/2004 | Muranaka et al. |
| 6,742,159 B2 | 5/2004 | Sakurai |
| 6,745,364 B2 | 6/2004 | Bhatt et al. |
| 6,754,856 B2 | 6/2004 | Cofler et al. |
| 6,765,740 B2 | 7/2004 | Tsuchiya |
| 6,779,148 B2 | 8/2004 | Tanaka |
| 6,792,501 B2 | 9/2004 | Chen et al. |
| 6,823,424 B2 | 11/2004 | Larson et al. |
| 6,832,340 B2 | 12/2004 | Larson et al. |
| 6,845,472 B2 | 1/2005 | Walker et al. |
| 6,851,081 B2 | 2/2005 | Yamamoto |
| 6,880,103 B2 | 4/2005 | Kim et al. |
| 6,883,130 B2 | 4/2005 | Wilhelmsson et al. |
| 6,909,758 B2 | 6/2005 | Ramesh et al. |
| 6,912,682 B1 | 6/2005 | Aoki |
| 6,941,493 B2 | 9/2005 | Phelps |
| 6,977,888 B1 | 12/2005 | Frenger et al. |
| 6,990,604 B2 | 1/2006 | Binger |
| 7,027,539 B2 | 4/2006 | Yang et al. |
| 7,047,473 B2 | 5/2006 | Hwang et al. |
| 7,072,307 B2 | 7/2006 | Tong et al. |
| 7,168,023 B2 | 1/2007 | Morgan et al. |
| 7,200,770 B2 | 4/2007 | Hartwell et al. |
| 7,231,580 B2 | 6/2007 | Shiota et al. |
| 7,249,289 B2 | 7/2007 | Muranaka et al. |
| 7,339,759 B2 | 3/2008 | Hashimoto |
| 7,340,641 B1 | 3/2008 | Binger |
| 7,355,803 B2 | 4/2008 | Yang |
| 7,418,436 B2 | 8/2008 | Maeda et al. |
| 7,421,547 B2 | 9/2008 | Matsui et al. |
| 7,519,894 B2 | 4/2009 | Weiß et al. |
| 7,523,381 B2 | 4/2009 | Eggleston et al. |
| 7,529,965 B2 | 5/2009 | Ikeuchi et al. |
| 7,548,495 B2 | 6/2009 | Kobayashi |
| 7,562,285 B2 | 7/2009 | Wang et al. |
| 7,624,298 B2 | 11/2009 | Kasahara et al. |
| 7,657,783 B2 | 2/2010 | Levitan |
| 7,836,386 B2 | 10/2010 | Schumacher et al. |
| 7,831,882 B2 | 11/2010 | Tsern et al. |
| 7,831,888 B2 | 11/2010 | Wang et al. |
| 7,882,423 B2 | 2/2011 | Wang et al. |
| 7,949,931 B2 | 5/2011 | Lastras-Montano |
| 8,042,023 B2 | 10/2011 | Balb |
| 8,132,077 B2 | 3/2012 | Wang et al. |
| 9,870,283 B2 | 1/2018 | Shaeffer et al. |
| 2001/0056567 A1 | 12/2001 | Sakurai |
| 2002/0053042 A1 | 5/2002 | Brown |
| 2002/0144210 A1 | 10/2002 | Borkenhagen et al. |
| 2003/0115417 A1 | 6/2003 | Corrigan |
| 2004/0073649 A1 | 4/2004 | Inami et al. |
| 2004/0088497 A1 | 5/2004 | Deans et al. |
| 2004/0139310 A1 | 7/2004 | Maeda et al. |
| 2004/0205433 A1 | 10/2004 | Gower et al. |
| 2004/0209420 A1 | 10/2004 | Ljungcrantz et al. |
| 2004/0237001 A1 | 11/2004 | Schulz et al. |
| 2004/0264030 A1 | 12/2004 | Yang |
| 2005/0055522 A1 | 3/2005 | Yagi |
| 2005/0073899 A1 | 4/2005 | Gallivan et al. |
| 2006/0075291 A1 | 4/2006 | Takahashi |
| 2006/0077750 A1 | 4/2006 | Pescatore |
| 2006/0098320 A1 | 5/2006 | Koga et al. |
| 2006/0123483 A1 | 6/2006 | Cohen |
| 2006/0126460 A1 | 6/2006 | Kobayashi |
| 2006/0277434 A1 | 12/2006 | Tsern et al. |
| 2007/0002482 A1 | 1/2007 | Daikokuya et al. |
| 2007/0043917 A1 | 2/2007 | Matsui et al. |
| 2007/0150872 A1 | 6/2007 | Vohra |
| 2007/0162825 A1 | 7/2007 | Wang et al. |
| 2008/0046802 A1 | 2/2008 | Honda |
| 2008/0163007 A1 | 7/2008 | Shaeffer et al. |
| 2008/0195922 A1 | 8/2008 | Lee |
| 2009/0006863 A1 | 1/2009 | Mizuno |

(56) References Cited

U.S. PATENT DOCUMENTS

| | | | |
|---|---|---|---|
| 2009/0113133 | A1 | 4/2009 | Kim et al. |
| 2009/0204871 | A1 | 8/2009 | Eggleston et al. |
| 2009/0235113 | A1 | 9/2009 | Shaeffer et al. |
| 2010/0217915 | A1 | 8/2010 | O'Connor et al. |
| 2011/0040924 | A1 | 2/2011 | Selinger |
| 2011/0246857 | A1 | 10/2011 | Bae et al. |
| 2012/0179866 | A1 | 7/2012 | Davis et al. |
| 2014/0089755 | A1 | 3/2014 | Kantamsetti et al. |
| 2014/0108889 | A1* | 4/2014 | Shaeffer .............. G06F 11/1008 714/768 |
| 2015/0331742 | A1 | 11/2015 | Liang et al. |
| 2016/0179634 | A1 | 6/2016 | Alexander et al. |
| 2017/0103800 | A1* | 4/2017 | Ware .................. G06F 11/1048 |
| 2019/0115059 | A1* | 4/2019 | Ware ...................... G11C 5/063 |

OTHER PUBLICATIONS

Cardarilli et al., "Design of a Fault Tolerant Solid State Mass Memory," IEEE Transactions of Reliability, vol. 52, No. 4, Dec. 2003, pp. 476-491. 16 pages.
Dell Computer Corporation et al., "Serial ATA II: Electrical Specification." Rev. 1, May 26, 2004. 187 pages.
Digitai Equipment Corporation, "ESE50 SDI Solid State Disk Service Guide," Jun. 1993. 132 pages.
Digital Equipment Corporation, "Hardware Documentation—Machines DEC—VAX Hardware Reference," printed from http://www.netbsd.org/documentation/hardware/Machines/DEC/vax on May 13, 2005. 91 pages.
Digitai Equipment Corporation, "Software Product Description, Product Name: HSC High Performance Software, Ver. 8.6," Jun. 1996. 6 pages.
Digital Equipment Corporation, "Software Product Description, Product Name: HSC Software, Ver. 6.5." Jun. 1992. 4 pages.
EP Communication dated Jan. 2, 2013 in EP Application No. 07794938.6-2224. 3 pages.
EP Extended European Search Report dated Mar. 18, 2022 re: EP Appln. No. 19775765.1. 11 pages.
Geisler, J., "Error Detection & Correction," Taylor University, Computer and System Sciences Department. Sep. 16, 2005. 21 pages.
Grosspietsch et al., "A Memory Interface Chip Designed for Fault Tolerance," VLSI System Design, Jun. 1987, pp. 112-118. 5 pages.
Grosspietsch et al., "The VLSI Implementation of a Fault-Tolerant Memory Interface—a Status Report," VLSI '85, 1986, pp. 155-164. 10 pages.
Haas et al., "Advances in Server Memory Technology," presented at Spring 2005 Intel Developers Forum, San Francisco, CA, Mar. 1, 2005. 31 pages.
Hanna, P., "Error Detection and Correction," Lecture 9. Queen's University-Belfast, Jan. 3, 2005. 12 pages.
Hodgart et al., "A (16,8) Error Correcting Code (T=2) for Critical Memory Applications," DASIA2000, Montreal, Canada, May 22-26, 2000. 4 pages.
JEDEC Standand No. 250 Jul. 2017.
Kilbuck et al., "Fully Buffered DIMM—Unleashing Server Capacity," Micron Technology, Inc., Apr. 8, 2005. 199 pages.
May et al., "HiPER: A Compact Narrow Channel Router with Hop-by-Hop Error Correction," IEEE Transactions on Parallel and Distributed Systems, vol. 13. No. 5. May 2002, pp. 465-498. 14 pages.
Notification of Transmittal of the International Search Report and the Written Opinion of the International Searching Authority, or the Declaration dated Jul. 22, 2019 re: Int'l Appln. No. PCT/US19/023236. 11 Pages.
Pearson Education, "Error Detection and Correction," Logic and Computer Design Fundamentals, 3rd Ed., 2004, pp. 1-5. 5 pages.
Sidiropoulos et al., "700 Mb/s/pin CMOS Signaling Interface Using Current Integrating Receivers," IEEE Journal of Solid-State Circuits, vol. 32, No. 5. pp. 681-690, May 1997. 10 pages.
Siewiorek, Dan, "20 Fault Tolerance & Memory Hierarchy," Lecture Handout, Carnegie Mellon University, Nov. 23, 1998. 18 pages.
Wicker, Stephen B., "Error Control Systems for Digital Communications and Storage" Prentice-Hall, 1995, pp. 392-423. 17 pages.
Wikipedia, "Forward Error Correction," http/en.wikipedia.org/wiki/forward_error_correction, Printed Jun. 20, 2006. 3 pages.

* cited by examiner

COMMAND/ADDRESS CHANNEL ERROR DETECTION

DETAILED DESCRIPTION OF THE EMBODIMENTS

A memory component (e.g., dynamic random access memory-DRAM integrated circuit) receives command and address information for activate row and access column operations (e.g., to read and/or write data.) The commands to activate and then access data, and the data itself, are all communicated between a controller and the memory component at different times. The controller calculates an error detecting code (EDC) value on the activate command information (e.g., bank address and row address) and stores it indexed by the bank address. Likewise, upon receiving the activate command, the memory component calculates an EDC value on the received activate command information and stores it indexed by the bank address.

When an access command is received by the memory component, the received bank address is used to retrieve the stored EDC value. The retrieved EDC value is then combined with EDC values calculated from the access command information, and the data itself. Similar operations are performed by the controller to generate an expected EDC value to be compared with the EDC value calculated by the memory component.

In an embodiment, the combined EDC value may be transmitted to the controller for checking. In another embodiment, the combined EDC value may be checked against an EDC value received from the controller.

In an embodiment, the individual EDC values calculated for the activate and access command information may be transmitted individually to the controller for checking (i.e., without first being combined with other EDC values into a 'combined' EDC value.) These individual EDC values may be transmitted to the controller by 'modulating' EDC values for the data using an invertible function that takes the data EDC value and the command EDC value as inputs. The controller 'demodulates' the data EDC value and the command EDC value using an expected EDC value the controller calculated for the corresponding command as an input to the reverse of the invertible function. In an embodiment, the invertible function may be an exclusive-OR (XOR) operation between one or more bits of the data EDC value and the command EDC value.

Figure 1:
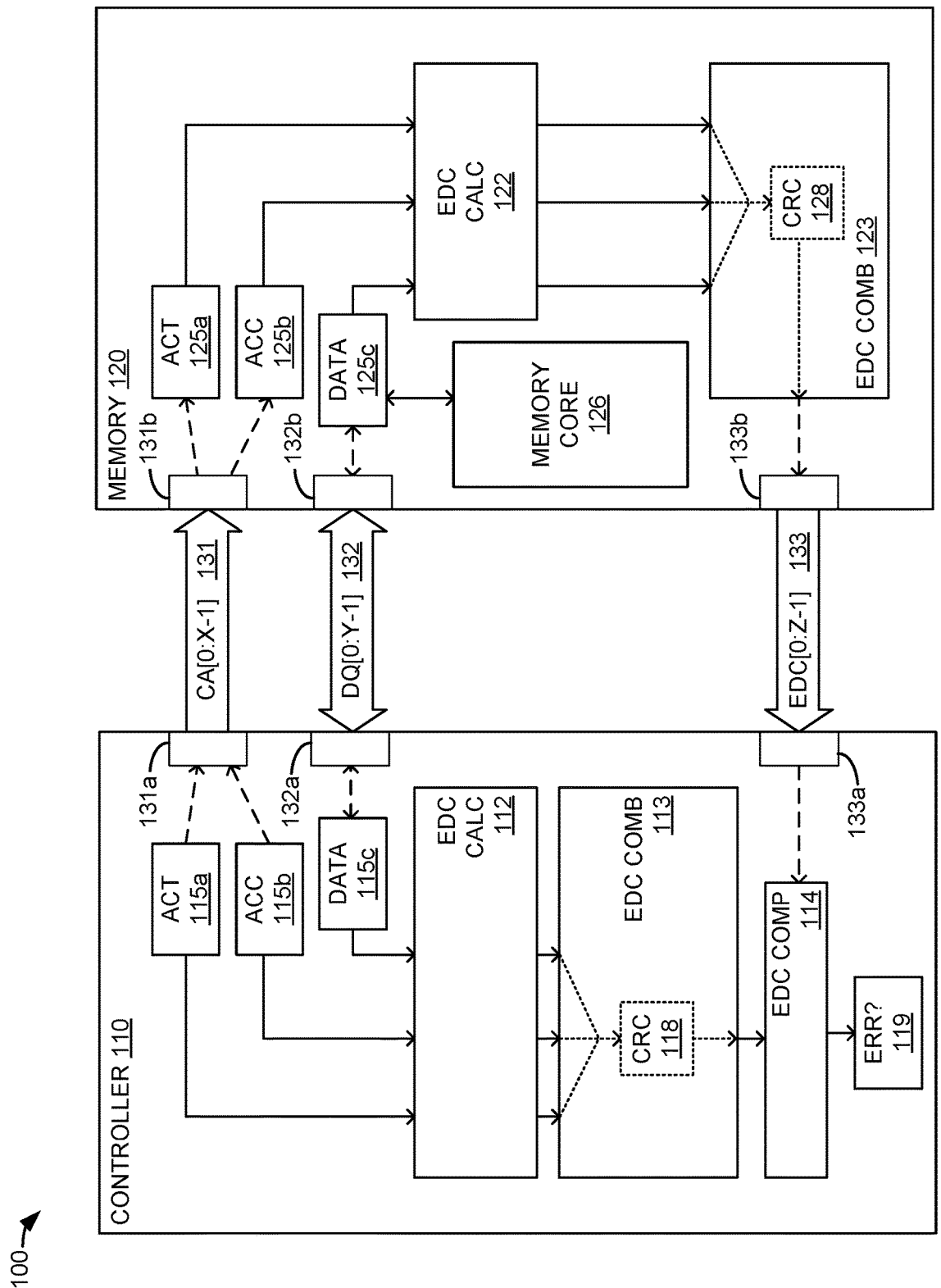
FIG. 1 is a block diagram of a memory system.

FIG. 1 is a block diagram of a memory system. In FIG. 1, memory system 100 comprises controller 110 and memory component 120. Controller 110 includes error-detection code calculation circuitry 112, error-detection code combining circuitry 113, error-detection code comparison circuitry 114, error indicator 119, command/address (CA) interface 131a, data (DQ) interface 132a, and error-detection code (EDC) interface 133a. Controller 110 also generates and/or processes activate command and information 115a, access command and information 115b, and data 115c. Memory component 120 includes error-detection code calculation circuitry 122, error-detection code combining circuitry 123, memory core (e.g., storage cell array) 126, CA interface 131b, DQ interface 132b, and EDC interface 133b. Memory component 120 also receives, responds to, and/or processes received activate command and information 125a, received access command and information 125b, and data 125c.

Controller 110 and memory component 120 may be integrated circuit type devices, such as are commonly referred to as a "chips". A memory controller, such as controller 120, manages the flow of data going to and from memory devices and/or memory modules. Memory component 120 (also referred to as memory 120) may be a standalone device, or may be a component of a memory module. A memory controller can be a separate, standalone chip, or integrated into another chip. For example, a memory controller may be included on a single die with a microprocessor, or included as part of a more complex integrated circuit system such as a block of a system on a chip (SOC).

Controller 110 is operatively coupled to memory component 120 via CA interface 131a that is coupled to CA signal lines 131. CA signal lines 131 (and corresponding CA interface 131a on controller 110 and CA interface 131b on memory component 120) may be composed of X number of signal lines. In an embodiment, X=11. In an embodiment, CA signal lines 131 may include one or more (e.g., 1) data bus inversion (DBI) signal lines. Controller 110 is operatively coupled to memory component 120 to send commands and associated information (e.g., addresses) to memory 120 via CA signal lines 131. Memory component 120 receives these commands (and associated information—e.g., addresses) via CA interface 131b that is also coupled to CA signal lines 131.

Controller 110 is operatively coupled to memory 120 via DQ interface 132a that is coupled to DQ signal lines 132. DQ signal lines 132 (and corresponding DQ interface 132a on controller 110 and DQ interface 132b on memory component 120) may be composed of Y number of signal lines. In an embodiment, Y=18. In an embodiment, DQ signal lines 132 may include one or more (e.g., 2) DBI signal lines.

Controller 110 and memory component 120 are operatively coupled via DQ signal lines 132 to bidirectionally communicate data (e.g., data 115c and/or data 125c). Memory component 120 may store (e.g., in memory core 126) and retrieve (e.g., from memory core 126) data communicated via DQ interface 132b and DQ signal lines 132.

Memory 120 is operatively coupled to controller 110 via EDC interface 133b that is coupled to EDC signal lines 133. EDC signal lines 133 (and corresponding EDC interface 133a on controller 110 and EDC interface 133b on memory component 120) may be composed of Z number of signal lines. In an embodiment, Z=2. In an embodiment, EDC signal lines 133 may include one or more (e.g., 1) DBI signal lines. Memory 120 is operatively coupled to controller 110 to send error-detection code information (e.g., EDC code bits) to controller 110 via EDC interface 133b and EDC signal lines 133. Controller 110 receives these EDC bits via EDC interface 133a and EDC signal lines 133.

In an embodiment, controller 110 sends, via CA signal lines 131, activate command 115a to memory component 120. Activate command 115a includes an associated bank address (BA) value and a row address (R or ROW) value. Memory component 120 receives the sent command and associated address information. However, during the transmission and/or reception of activate command 115a, an error may occur such that one or more bits of the received command and/or associated address information is not the same as the sent activate command 115a. This is illustrated in FIG. 1 by activate command 125a-which may have the same (i.e., correct), or erroneous (i.e., corrupted), command and/or associated address information as activate command 115a. The received activate command 125a is provided to EDC calculation circuitry 122.

Controller 110 also sends, via CA signal lines 131, access command 115b to memory component 120. Access command 115b may be a read or write command that respectively reads data from, or stores data to, memory core 126. Access command 115b includes an associated bank address (BA) value and a column address (C or COL) value. Memory component 120 receives the sent command and associated address information. However, during the transmission and/or reception of access command 115b, an error may occur such that one or more bits of the received command and/or associated address information is not the same as the sent access command 115b. This is illustrated in FIG. 1 by access command 125b-which may have the same (i.e., correct), or erroneous (i.e., corrupted), command and/or associated address information as access command 115b. The received access command 125b is provided to EDC calculation circuitry 122.

If access command 115b is a write, controller 110 also sends, via DQ signal lines 132, data 115c to memory component 120. Memory component 120 receives the sent data. However, during the transmission and/or reception of data 115c, an error may occur such that one or more bits of the received data is not the same as the sent data. This is illustrated in FIG. 1 by data 125c-which may have the same (i.e., correct), or erroneous (i.e., corrupted), value as data 115c. The received data 125c is provided to EDC calculation circuitry 122. In an embodiment, EDC calculation circuitry 122 calculates a CRC-8 type error detection code.

If access command 115b is a read, memory component 120 retrieves (from memory core 126) and sends, via DQ signal lines 132, data 125c to controller 110. Controller 110 receives the sent data. However, during the storage (by memory 126), transmission, and/or reception of data 125c, an error may occur such that one or more bits of the received data is not the same as the sent data. This is illustrated in FIG. 1 by data 115c-which may have the same (i.e., correct), or erroneous (i.e., corrupted), value as data 125c. The received data 115c is provided to EDC calculation circuitry 112. In an embodiment, EDC calculation circuitry 112 calculates a CRC-8 type error detection code.

Memory 120 provides received activate command 125a, received access command 125b, and data 125c (which was either received from controller 110 or retrieved from memory core 126, as appropriate) to EDC calculation circuitry 122. In an embodiment, activate command 125a, access command 125b, and data 125c may be provided to EDC calculation circuitry 122 at different points in time. Thus, EDC calculation circuitry 122 calculates three EDC values. These three EDC values are combined by EDC combining circuitry 123 into a single cyclic redundancy check (CRC) value 128. CRC value 128 is sent, via EDC signal lines 133 to controller 110.

Controller 110 provides activate command 115a, access command 115b, and data 115c to EDC calculation circuitry 112. In an embodiment, activate command 115a, access command 115b, and data 115c may be provided to EDC calculation circuitry 112 at different points in time. Thus, EDC calculation circuitry 112 calculates three EDC values. These three EDC values are combined by EDC combining circuitry 113 into a single cyclic redundancy check (CRC) value 118. EDC combining circuitry 113 provides the CRC value 118 to EDC compare circuitry 114.

EDC compare circuitry 114 compares the CRC value 118 produced by controller 110 with the CRC value 128 received from memory 120. If the two CRC values are equivalent (e.g., equal), then error indicator 119 is set to indicate that an error was not detected. If the two CRC values are not equivalent (e.g., not equal), then error indicator 119 is set to indicate that an error has been detected.

In an embodiment, EDC calculation circuitry 113 and EDC calculation circuitry 123 generate an error-detection code that has the property of being linear with respect to the exclusive-OR ($\oplus$) operation. In other words, the function used to generate CRC 118 and CRC 128 satisfies the following: $CRC(a) \oplus CRC(b) = CRC(a \oplus b)$. Thus, EDC combining circuitry 113 and EDC combining circuitry 114 may comprise bitwise exclusive-OR's (XORs) of the three EDC values received from EDC calculation circuitry 113 and EDC calculation circuitry 114, respectively.

It should be understood from the foregoing that since activate command 115a, access command 115b, and data 115c are all inputs to the calculation of controller CRC value 118, and since received activate command 125a, received access command 125b, and data 125c are all inputs to the calculation of memory CRC value 128, and since memory CRC value 128 is transmitted to controller 110, certain errors (e.g., those with less than a given number of corrupted bits) may be detected in the transmission, reception, and/or storage of activate command 115a, access command 115b, data 115c, data 125c, and/or CRC value 128.

Figure 2:
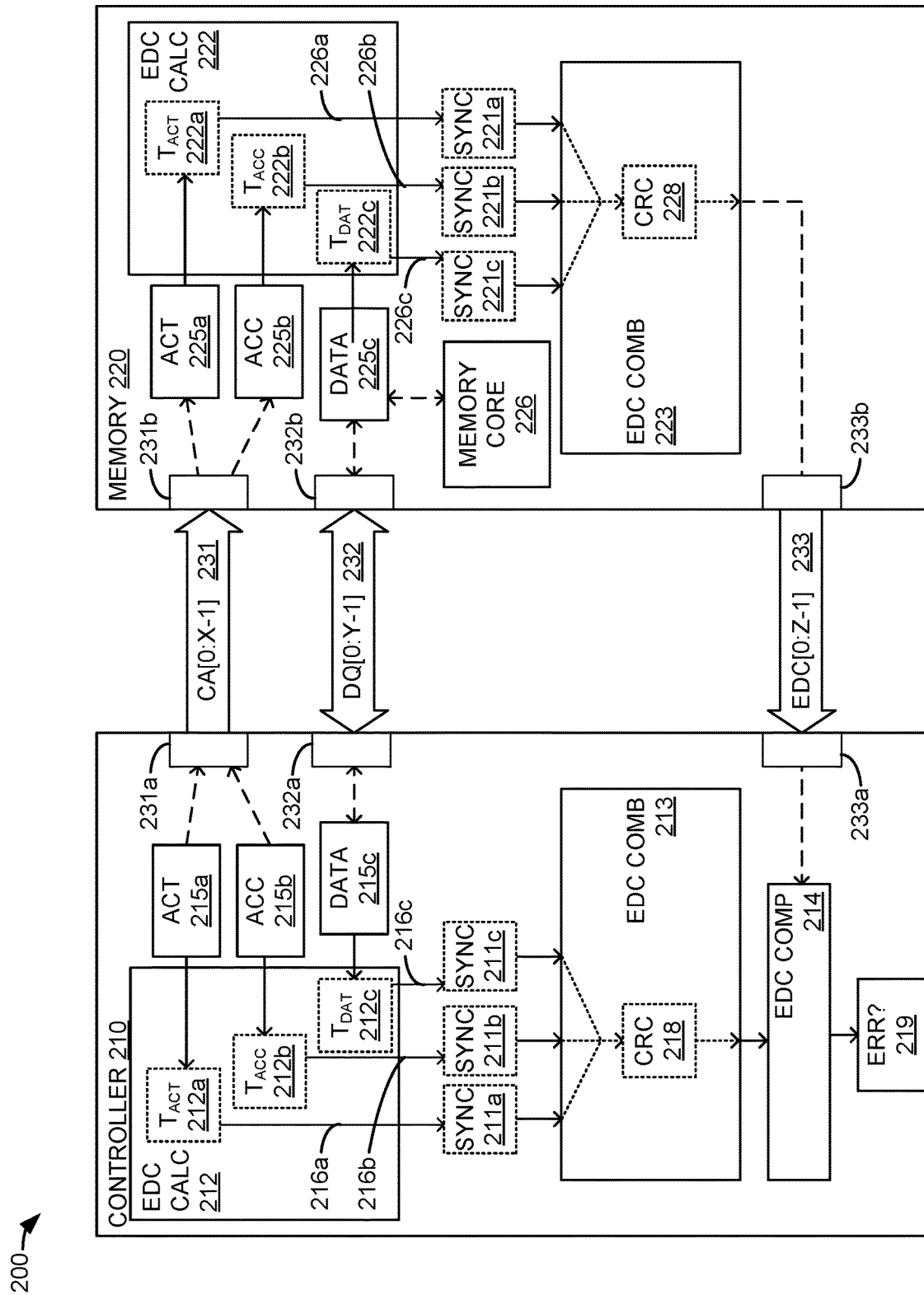
FIG. 2 is a block diagram of a memory system.

FIG. 2 is a block diagram of a memory system. In FIG. 2, memory system 200 comprises controller 210 and memory component 220. Controller 210 includes activate command information synchronizer 211a, access command information synchronizer 211b, data synchronizer 211c, error-detection code (EDC) calculation circuitry 212, error-detection code combining circuitry 213, error-detection code comparison circuitry 214, error indicator 219, command/address (CA) interface 231a, data (DQ) interface 232a, and EDC interface 233a. Controller 210 generates and/or processes activate command information 215a, access command information 215b, and data 215c.

Memory component 220 (also referred to as memory 220) includes activate command information synchronizer 221a, access command information synchronizer 221b, data synchronizer 221c, error-detection code calculation circuitry 222, error-detection code combining circuitry 223, memory core (e.g., storage cell array) 226, CA interface 231b, DQ interface 232b, and EDC interface 233b. Memory component 220 receives, responds to, and/or processes received activate command information 225a, received access command information 225b, and data 225c. Controller 210 and memory component 220 may be integrated circuit type devices.

Controller 210 is operatively coupled to memory 220 via CA interface 231a that is coupled to CA signal lines 231. CA signal lines 231 (and corresponding CA interface 231a on controller 210 and CA interface 231b on memory component 220) may be composed of X number of signal lines. In an embodiment, X=11. In an embodiment, CA signal lines 231 may include one or more (e.g., 1) data bus inversion (DBI) signal lines. Controller 210 is operatively coupled to memory 220 to send commands and associated information (e.g., addresses) to memory 220 via CA signal lines 231. Memory 220 receives these commands (and associated information—e.g., addresses) via CA interface 231b that is also coupled to CA signal lines 231.

Controller 210 is operatively coupled to memory 220 via DQ interface 232a that is coupled to DQ signal lines 232. DQ signal lines 232 (and corresponding DQ interface 232a on controller 210 and DQ interface 232b on memory component 120) may be composed of Y number of signal lines. In an embodiment, Y=18. In an embodiment, DQ signal lines 232 may include one or more (e.g., 2) DBI signal lines. Controller 210 and memory component 220 are operatively coupled via DQ signal lines 232 to bidirectionally communicate data (e.g., data 215c and/or data 225c). Memory 220 may store (e.g., in memory core 226) and retrieve (e.g., from memory core 226) data communicated via DQ interface 232b and DQ signal lines 232.

Memory 220 is operatively coupled to controller 210 via EDC interface 233b that is coupled to EDC signal lines 233. EDC signal lines 233 (and corresponding EDC interface 233a on controller 210 and EDC interface 233b on memory component 220) may be composed of Z number of signal lines. In an embodiment, Z=2. In an embodiment, EDC signal lines 233 may include one or more (e.g., 1) DBI signal lines. Memory 220 is operatively coupled to controller 210 to send error-detection code information (e.g., EDC code bits) to controller 210 via EDC interface 233b and EDC signal lines 233. Controller 210 receives these EDC bits via EDC interface 233a and EDC signal lines 233.

In an embodiment, controller 210 sends, via CA signal lines 231, activate command information 215a to memory component 220. Activate command information 215a includes, but is not limited to, a bank address (BA) value and a row address (R or ROW) value. Memory component 220 receives the sent activate command information. However, during the transmission and/or reception of activate command information 215a, an error may occur such that one or more bits of the received activate command information 225a is not the same as the sent activate command information 215a. The received activate command information 225a is provided to EDC calculation circuitry 222. The received activate command information 225a is provided to EDC calculation circuitry 222 at a first point in time (e.g., clock cycle, etc.) This is illustrated in FIG. 2 by $T_{ACT}$ 222a. The result of the EDC calculation that is based on activate command information 225a (activate command information EDC code value 226a) is provided to activate command information synchronizer 221a. In an embodiment, EDC calculation circuitry 222 calculates a CRC-8 type error detection code.

Activate command information synchronizer 221a stores the activate command information EDC code value 226a until other inputs are ready to be combined with the activate command information EDC code value 226a. Activate command information synchronizer 221a may be a memory. In an embodiment, activate command information synchronizer 221a may be a register file that is indexed by the bank address value from received activate command information 225a. This allows the activate command information EDC code value 226a to be retrieved from activate command information synchronizer 221a using a bank address value from a second (e.g., access) command that is received at a later point in time.

At a second point in time, after the activate command information 215a has been transmitted to memory 220, controller 210 transmits, via CA signal lines 231, access command information 215b to memory component 220. Access command information 215b may be associated with a read or write command that respectively reads data from, or stores data to, memory core 126. Access command information 215b includes, but is not limited to, a bank address (BA) value and a column address (C or COL) value. Memory component 220 receives the transmitted access command information. However, during the transmission and/or reception of access command information 215b, an error may occur such that one or more bits of the received access command information 225b is not the same as the transmitted access command information 215b. The received access command information 225b is provided to EDC calculation circuitry 222. The received access command information 225b is provided to EDC calculation circuitry 222 at a second point in time (e.g., clock cycle, etc.) This is illustrated in FIG. 2 by $T_{A}CC$ 222b. The result of the EDC calculation that is based on access command information 225b (access command information EDC code value 226b) is provided to access command information synchronizer 221b.

Access command information synchronizer 221b stores the access command information EDC code value 226b until other inputs are ready to be combined with the access command information EDC code value 226b. Activate command information synchronizer 221b may be a memory. In an embodiment, activate command information synchronizer 221a may be a register.

If access command information 215b is associated with a write command, controller 210 transmits, via DQ signal lines 232, data 215c to memory component 220. Memory component 220 receives the transmitted data. However, during the transmission and/or reception of data 215c, an error may occur such that one or more bits of the received data 225c is not the same as the sent data 215c. The received data 225c is provided to EDC calculation circuitry 222. The received data 225c is provided to EDC calculation circuitry 222 at a third point in time (e.g., clock cycle, etc.) This is illustrated in FIG. 2 by $T_{DAT}$ 222c. The result of the EDC calculation that is based on received data 225c (data EDC code value 226c) is provided to data synchronizer 221c.

If access command information 215b is associated with a read command, memory component 220 retrieves (from memory core 226) and transmits, via DQ signal lines 232, retrieved data 225c to controller 210. The retrieved data 225c is provided to EDC calculation circuitry 222. The retrieved data 225c is provided to EDC calculation circuitry 222 at a third point in time (e.g., clock cycle, etc.) This is illustrated in FIG. 2 by $T_{DAT}$ 222c. The result of the EDC calculation that is based on retrieved data 225c (data EDC code value 226c) is provided to data synchronizer 221c.

Data synchronizer 221c stores the data EDC code value 226c until other inputs are ready to be combined with the data EDC code value 226c. Data synchronizer 221c may be a memory. Data synchronizer 221c may be a register or a buffer memory.

Activate command information synchronizer 221a, access command information synchronizer 221b, and data synchronizer 221c respectively provide activate command information EDC code value 226a, access command information EDC code value 226b, and data EDC code value 226c to EDC combining circuitry 223. In an embodiment, activate command information synchronizer 221a, access command information synchronizer 221b, and data synchronizer 221c may be controlled to provide EDC values for combination that all correspond to the bank, row, and column being accessed by the access command. In an embodiment, activate command information synchronizer 221a, access command information synchronizer 221b, and data synchronizer 221c may be controlled to provide EDC values for combination that correspond to one or more of different banks, rows, and/or columns. The EDC values are combined by EDC combining circuitry 223 into a single cyclic redundancy check (CRC) value 228. CRC value 228 is transmitted, via EDC signal lines 233 to controller 210.

Controller 210 provides activate command information 215a, access command information 215b, and data 215c to EDC calculation circuitry 212. In an embodiment, activate command 215a, access command 215b, and data 215c may be provided to EDC calculation circuitry 212 at different points in time. This is illustrated in FIG. 2 by $T_{ACT}$ 212a, $T_{ACC}$ 212b, and $T_{DAT}$ 212c. The respective results of these EDC calculations are provided to the corresponding activate command information synchronizer 211a, access command information synchronizer 211b, or data synchronizer 211c. In an embodiment, EDC calculation circuitry 212 calculates a CRC-8 type error detection code.

Activate command information synchronizer 211a, access command information synchronizer 211b, and data synchronizer 211c respectively provide activate command information EDC code value 216a, access command information EDC code value 216b, and data EDC code value 216c to EDC combining circuitry 213. In an embodiment, activate command information synchronizer 211a, access command information synchronizer 211b, and data synchronizer 211c may be controlled to provide EDC values for combination that all correspond to the bank, row, and column being accessed by the access command. In an embodiment, activate command information synchronizer 211a, access command information synchronizer 211b, and data synchronizer 211c may be controlled to provide EDC values for combination that correspond to one or more of different banks, rows, and/or columns. The EDC values are combined by EDC combining circuitry 213 into a single cyclic redundancy check (CRC) value 218. EDC combining circuitry 213 provides the CRC value 218 to EDC compare circuitry 214.

EDC compare circuitry 214 compares the CRC value 218 produced by controller 210 with the CRC value 228 received from memory 220. If the two CRC values are equivalent (e.g., equal), then error indicator 219 is set to indicate that an error was not detected. If the two CRC values are not equivalent (e.g., not equal), then error indicator 219 is set to indicate that an error has been detected.

In an embodiment, EDC calculation circuitry 213 and EDC calculation circuitry 223 generate an error-detection code that has the property of being linear with respect to the exclusive-OR ($\oplus$) operation. In other words, the function used to generate CRC 218 and CRC 228 satisfies the following: CRC(a)$\oplus$CRC(b)=CRC(a$\oplus$b). Thus, EDC combining circuitry 213 and EDC combining circuitry 214 may comprise bitwise exclusive-OR's (XORs) of the three EDC values received from synchronizers 211a-211c and synchronizer 221a-221c, respectively.

It should be understood from the foregoing that since activate command information 215a, access command information 215b, and data 215c are all inputs to the calculation of controller CRC value 218, and since received activate command information 225a, received access command information 225b, and data 225c are all inputs to the calculation of memory CRC value 228, and since memory CRC value 228 is transmitted to controller 210, certain errors (e.g., those with less than a given number of corrupted bits) may be detected in the transmission, reception, and/or storage of activate command information 215a, access command information 215b, data 215c, data 225c, and/or CRC value 228.

Figure 3A:
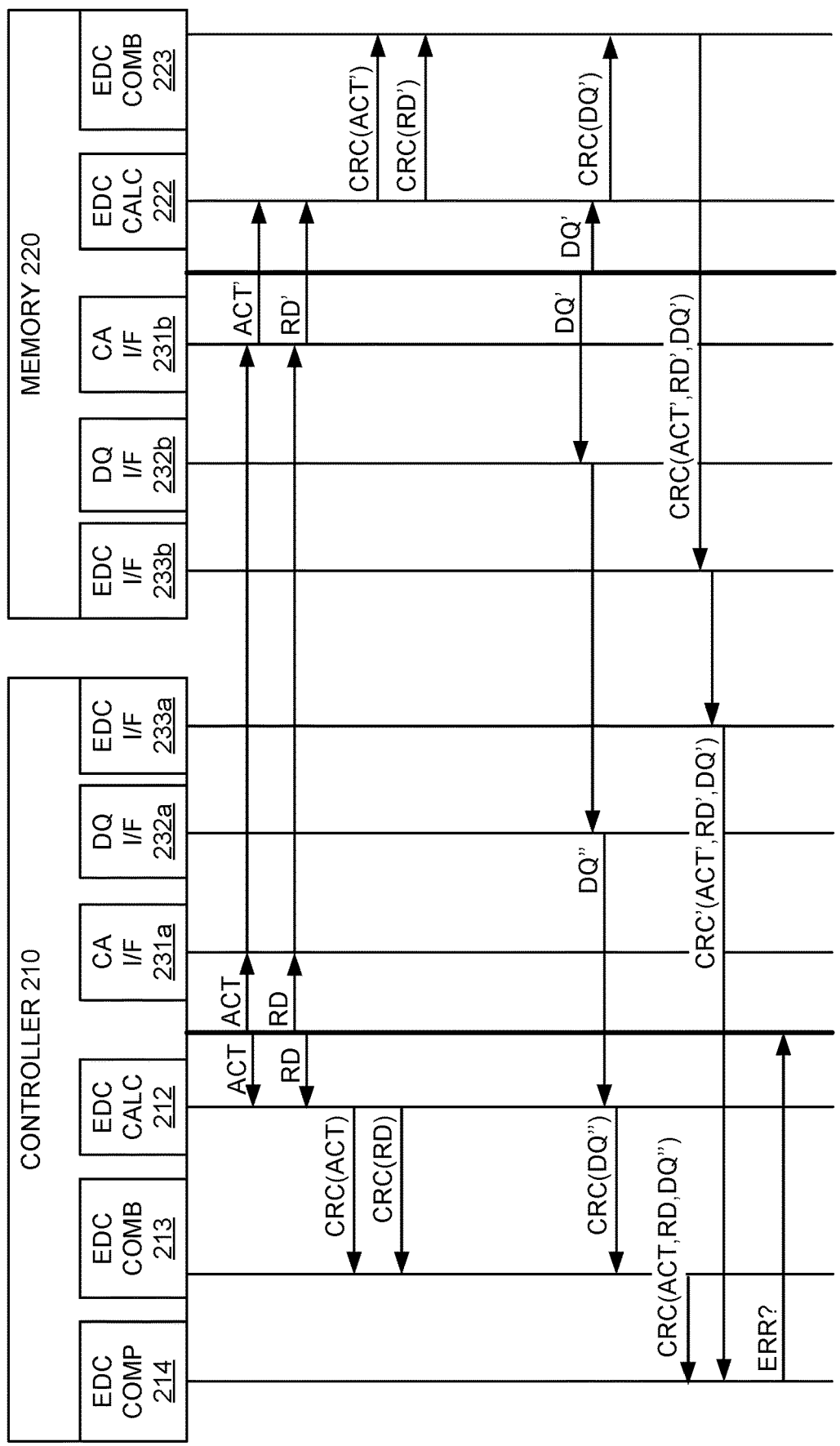
FIG. 3A is a flow diagram illustrating a read operation.

FIG. 3A is a flow diagram illustrating a read operation. Controller 210 issues an activate command. The activate command information, ACT, is transmitted by CA interface 231a to memory 220. Controller 210 also couples ACT to EDC calculation circuitry 222. The activate command information received by CA interface 231b of memory 220 may be corrupted during transmission. Thus, the activate command information received by memory 220 is illustrated as ACT' in FIG. 3A. Memory 220 couples ACT' from CA interface 231b to EDC calculation circuitry 222.

After the activate command, controller 210 issues a read command. The read command information, RD, is transmitted by CA interface 231a to memory 220. Controller 210 also couples RD to EDC calculation circuitry 222. The read command information received by CA interface 231b of memory 220 may be corrupted during transmission. Thus, the read command information received by memory 220 is illustrated as RD' in FIG. 3A. Memory 220 couples RD' from CA interface 231b to EDC calculation circuitry 222.

EDC calculation circuitry 212 of controller 210 calculates a first cyclic redundancy check (CRC) value from ACT and a second CRC value from RD. These are illustrated as CRC(ACT) and CRC(RD), respectively, in FIG. 3A. Likewise, EDC calculation circuitry 222 of memory 220 calculates a third CRC value from ACT' and a fourth CRC value from RD'. These are illustrated as CRC(ACT') and CRC(RD'), respectively, in FIG. 3A. CRC(ACT) and CRC(RD) are coupled by controller 210 to EDC combination circuitry 213. CRC(ACT') and CRC(RD') are coupled by memory 220 to EDC combination circuitry 223.

Because memory 220 is performing a read operation, memory 220 retrieves data, DQ', from a memory core. The data retrieved by memory 220 may be corrupted. Thus, the data retrieved by memory 220 is illustrated as DQ' in FIG. 3A. Memory 220 couples DQ' to DQ interface 232b and EDC calculation circuitry 222. EDC calculation circuitry 222 of memory 220 calculates a fifth CRC value from DQ'. This is illustrated as CRC(DQ'), in FIG. 3A. EDC combining circuitry 223 calculates a sixth CRC value from CRC (ACT'), CRC(RD') and CRC(DQ'). This is illustrated as CRC(ACT', RD', DQ'), in FIG. 3A.

Memory 220 couples CRC(ACT', RD', DQ') to EDC interface 233b. EDC interface 233b transmits CRC(ACT', RD', DQ') to controller 210. The CRC information received by CA interface 231a of controller 210 may be corrupted during transmission. Thus, the CRC information received by controller 210 is illustrated as CRC'(ACT', RD', DQ') in FIG. 3A. Controller 210 couples CRC'(ACT', RD', DQ') from EDC interface 233a to EDC comparison circuitry 214.

DQ interface 232b transmits DQ' to controller 210. The data received by CA interface 231a of controller 210 may be corrupted during transmission. Thus, the data received by memory 220 is illustrated as DQ" in FIG. 3A. Controller 210 couples DQ" from CA interface 231a to EDC calculation circuitry 212. EDC calculation circuitry 212 of controller 210 calculates a seventh CRC value from DQ". This is illustrated as CRC(DQ"), in FIG. 3A. EDC combining circuitry 213 calculates a eighth CRC value from CRC(ACT), CRC(RD) and CRC(DQ"). This is illustrated as CRC(ACT, RD, DQ"), in FIG. 3A.

EDC comparison circuitry 214 compares CRC'(ACT', RD', DQ') and CRC(ACT, RD, DQ") to determine whether transmissions described herein, or the storage of data was corrupted, and signal that result to other circuitry in controller 210. In other words, if CRC'(ACT', RD', DQ') equals CRC(ACT, RD, DQ"), then EDC comparison circuitry 214 indicates to controller 210 that no error has occurred. If CRC'(ACT', RD', DQ') does not equal CRC(ACT, RD, DQ"), then EDC comparison circuitry 214 indicates to controller 210 that an error has occurred.

Figure 3B:
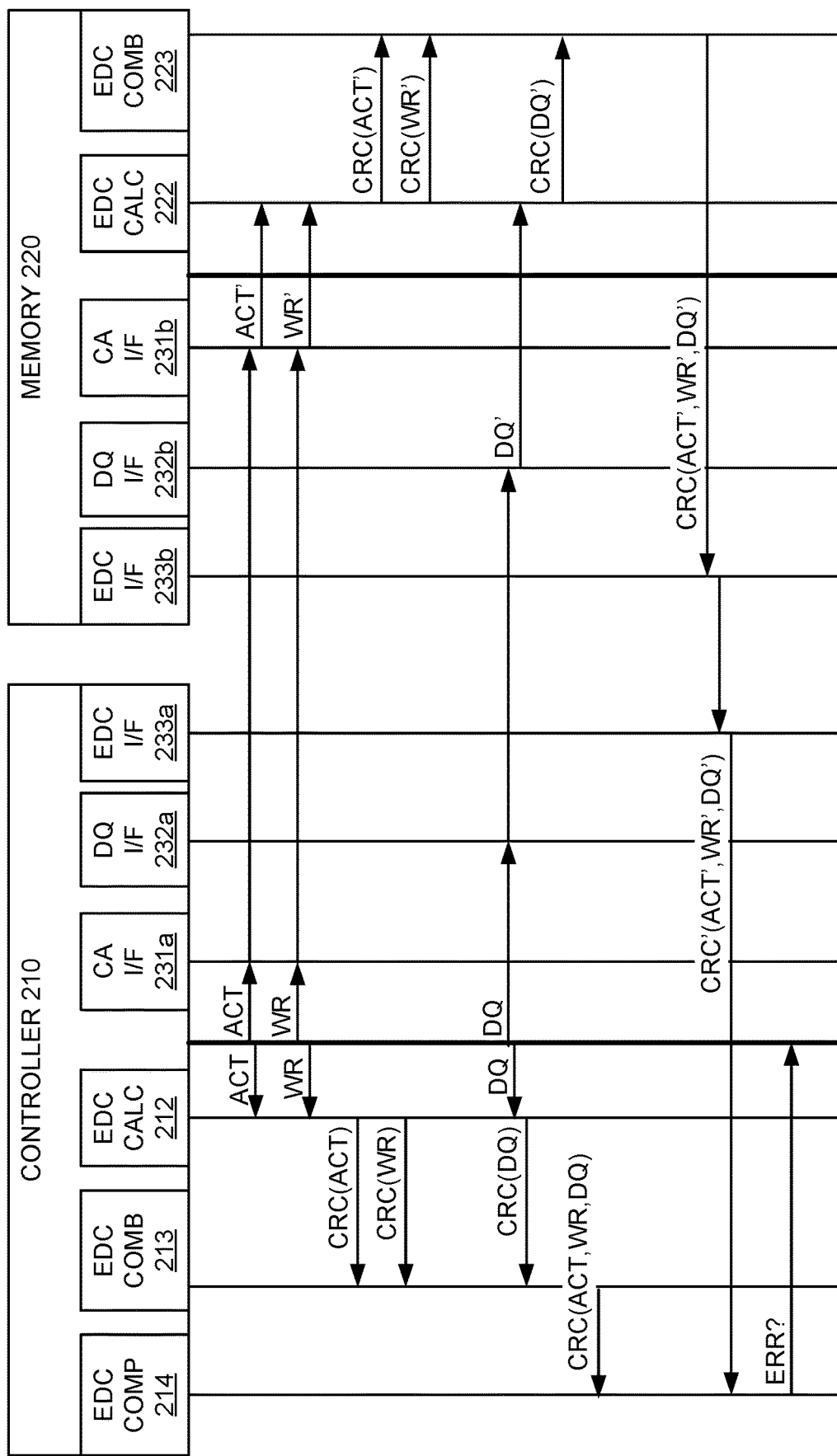
FIG. 3B is a flow diagram illustrating a write operation.

FIG. 3B is a flow diagram illustrating a write operation. Controller 210 issues an activate command. The activate command information, ACT, is transmitted by CA interface 231a to memory 220. Controller 210 also couples ACT to EDC calculation circuitry 222. The activate command information received by CA interface 231b of memory 220 may be corrupted during transmission. Thus, the activate command information received by memory 220 is illustrated as ACT' in FIG. 3B. Memory 220 couples ACT' from CA interface 231b to EDC calculation circuitry 222.

After the activate command, controller 210 issues a write command. The write command information, WR, is transmitted by CA interface 231a to memory 220. Controller 210 also couples WR to EDC calculation circuitry 222. The write command information received by CA interface 231b of memory 220 may be corrupted during transmission. Thus, the write command information received by memory 220 is illustrated as WR' in FIG. 3B. Memory 220 couples WR' from CA interface 231b to EDC calculation circuitry 222.

EDC calculation circuitry 212 of controller 210 calculates a first cyclic redundancy check (CRC) value from ACT and a second CRC value from WR. These are illustrated as CRC(ACT) and CRC(WR), respectively, in FIG. 3B. Likewise, EDC calculation circuitry 222 of memory 220 calculates a third CRC value from ACT' and a fourth CRC value from WR'. These are illustrated as CRC(ACT') and CRC (WR'), respectively, in FIG. 3B. CRC(ACT) and CRC(WR) are coupled by controller 210 to EDC combination circuitry 213. CRC(ACT') and CRC(WR') are coupled by memory 220 to EDC combination circuitry 223.

Because memory 220 is performing a write operation, controller 210 transmits, via DQ interface 232a, write data, DQ, to memory 220. The data received by memory 220 may be corrupted. Thus, the data received by DQ interface 232b of memory 220 is illustrated as DQ' in FIG. 3B. Memory 220 couples DQ' to EDC calculation circuitry 222. EDC calculation circuitry 222 of memory 220 calculates a fifth CRC value from DQ'. This is illustrated as CRC(DQ'), in FIG. 3B.

EDC combining circuitry 223 calculates a sixth CRC value from CRC(ACT'), CRC(WR') and CRC(DQ'). This is illustrated as CRC(ACT', WR', DQ'), in FIG. 3B.

Memory 210 couples CRC(ACT', WR', DQ') to EDC interface 233b. EDC interface 233b transmits CRC(ACT', WR', DQ') to controller 210. The CRC information received by CA interface 231a of controller 210 may be corrupted during transmission. Thus, the CRC information received by controller 210 is illustrated as CRC'(ACT', WR', DQ') in FIG. 3B. Controller 210 couples CRC'(ACT', WR', DQ') from EDC interface 233a to EDC comparison circuitry 214.

EDC calculation circuitry 212 of controller 210 calculates a sixth CRC value from DQ. This is illustrated as CRC(DQ), in FIG. 3B. EDC combining circuitry 213 calculates a seventh CRC value from CRC(ACT), CRC(WR) and CRC (DQ). This is illustrated as CRC(ACT, WR, DQ), in FIG. 3B.

EDC comparison circuitry 214 compares CRC'(ACT', WR', DQ') and CRC(ACT, WR, DQ) to determine whether transmissions described herein, or the storage of data was corrupted, and signal that result to other circuitry in controller 210. In other words, if CRC'(ACT', WR', DQ') equals CRC(ACT, WR, DQ), then EDC comparison circuitry 214 indicates to controller 210 that no error has occurred. If CRC'(ACT', WR', DQ') does not equal CRC(ACT, WR, DQ), then EDC comparison circuitry 214 indicates to controller 210 that an error has occurred.

Figure 4:
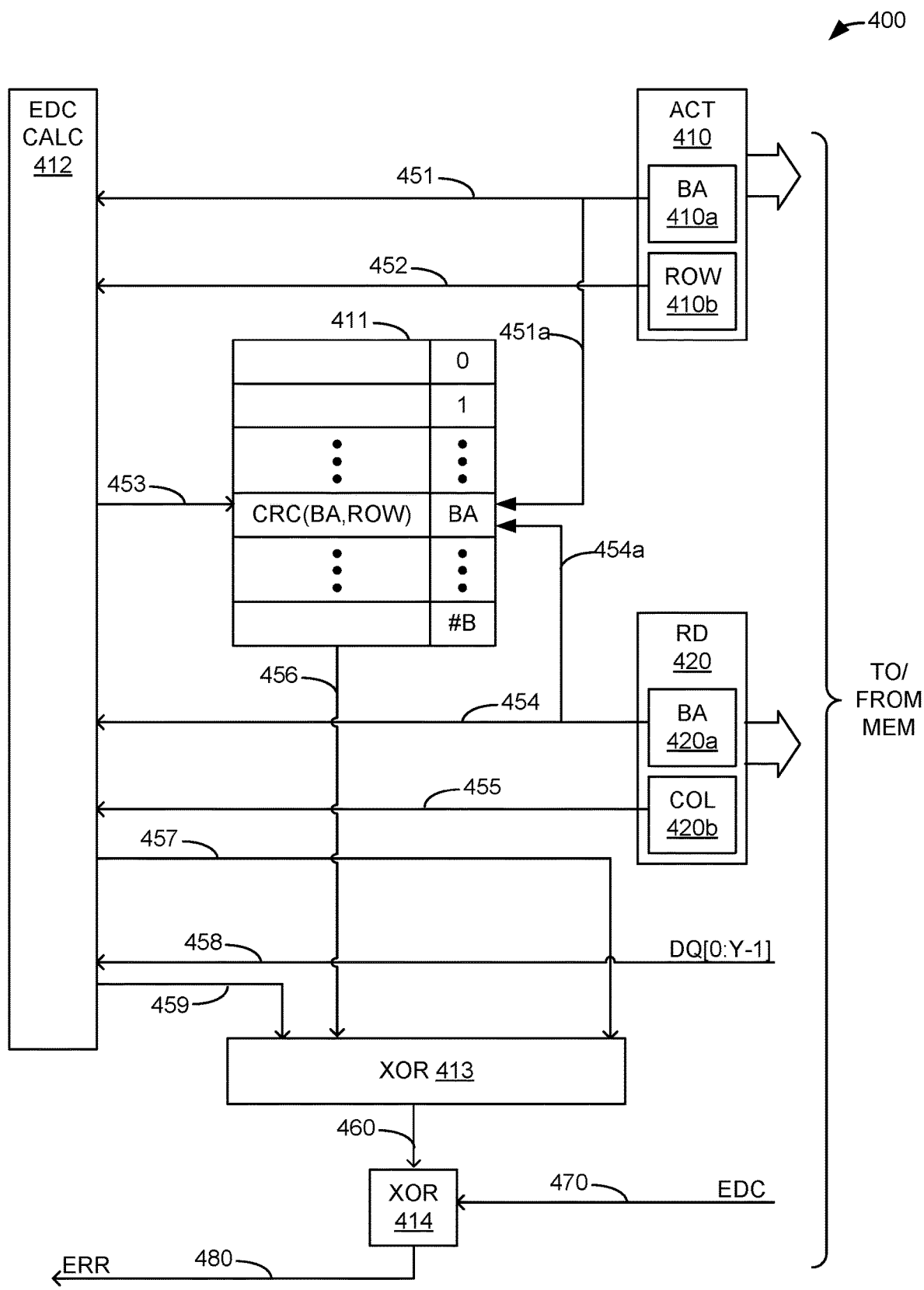
FIG. 4 is a diagram illustrating controller actions performed for a read operation.

FIG. 4 is a diagram illustrating controller actions performed for a read operation. In FIG. 4, controller 400 comprises register file (a.k.a., memory elements) 411, error-detection code (EDC) calculation circuitry 412, exclusive-OR (XOR) 413 and XOR 414. Register file 411 has a storage location corresponding to each bank address value so that register file 411 can read/write entries using a bank address and an index (a.k.a., address).

Controller 400 generates activate command information 410. Activate command information 410 includes a bank address (BA) value 410a and a row address value (ROW) 410b. Activate command information 410 is transmitted to a memory component.

Arrow 451 illustrates that BA value 410a is provided to EDC calculation circuitry 412. Arrow 452 illustrates that row address value 410b is provided to EDC calculation circuitry 412. Based on BA value 410a and ROW value 410b, EDC calculation circuitry 412 generates a first CRC value, CRC(0,0,0,BA,ROW). Arrow 453 illustrates that CRC(0,0,0,BA,ROW) is provided to, and stored in register file 411 at a location determined (indexed by) by bank address value 410a (as illustrated by arrow 451a).

Controller 400 generates read command information 420. Read command information 420 includes a bank address (BA) value 420a and a column address value (COL) 420b. Arrow 454 illustrates that BA value 420a is provided to EDC calculation circuitry 412. Arrow 455 illustrates that column address value 420b is provided to EDC calculation circuitry 412. Read command information 420 is transmitted to the memory component.

In FIG. 4, BA value 420a equals BA value 410a such that BA value 420a can be used to retrieve CRC(0,0,0,BA,ROW) from location BA of register file 411. This is illustrated by arrow 454a which indexes to the same location in register file 411 as arrow 451a. Arrow 456 illustrates that the result of reading location BA from register file 411 (i.e., stored value CRC(0,0,0,BA,ROW)) is provided to XOR 413.

Based on BA value 420a and column address value 420b EDC calculation circuitry 412 generates a second CRC value, CRC(0,BA,COL,0,0). Arrow 457 illustrates that CRC (0,BA,COL,0,0) is provided to XOR 413.

Controller 400 receives data (DQ) in response to the read command information 420 that was transmitted to the memory component. Arrow 458 illustrates that the read data DQ is provided to EDC calculation circuitry 412. Based on the read data DQ, EDC calculation circuitry 412 generates a third CRC value, CRC(DQ,0,0,0,0). Arrow 459 illustrates that CRC(DQ,0,0,0,0) is provided to XOR 413.

XOR 413 calculates CRC(0,0,0,BA,ROW)⊕CRC(0,BA, COL,0,0)⊕CRC(DQ,0,0,0,0). Because EDC calculation circuitry 412 generate an error-detection code that has the property of being linear with respect to the exclusive-OR (⊕) operation, CRC(0,0,0,BA,ROW)⊕CRC(0,BA,COL,0, 0)⊕CRC(DQ,0,0,0,0)=CRC(DQ, BA,COL, BA,ROW). CRC(DQ, BA,COL, BA,ROW) is an expected CRC value that, when an error has not occurred, will be equal to a memory calculated CRC value, CRC(DQ', BA", COL', BA', ROW').

Controller 400 receives a memory calculated CRC value, CRC(DQ', BA", COL', BA', ROW'), in response to the read command information 420 that was transmitted to the memory component. Arrow 470 illustrates that the memory calculated CRC value is provided to XOR 414. The expected CRC value CRC(DQ, BA,COL, BA,ROW) is bitwise XOR'd with CRC(DQ', BA", COL', BA', ROW') by XOR 414. This XOR operation effectively performs a bitwise comparison of the two CRC values.

If the expected CRC value CRC(DQ, BA,COL, BA,ROW) equals the memory calculated CRC value, CRC (DQ', BA", COL', BA', ROW'), then the output of XOR 414 indicates to controller 410 that no error has occurred. If the expected CRC value CRC(DQ, BA,COL, BA,ROW) does not equal the memory calculated CRC value, CRC(DQ', BA", COL', BA', ROW'), then the output of XOR 414 indicates to controller 410 that an error has occurred. This is illustrated in FIG. 4 by arrow 480.

Figure 5:
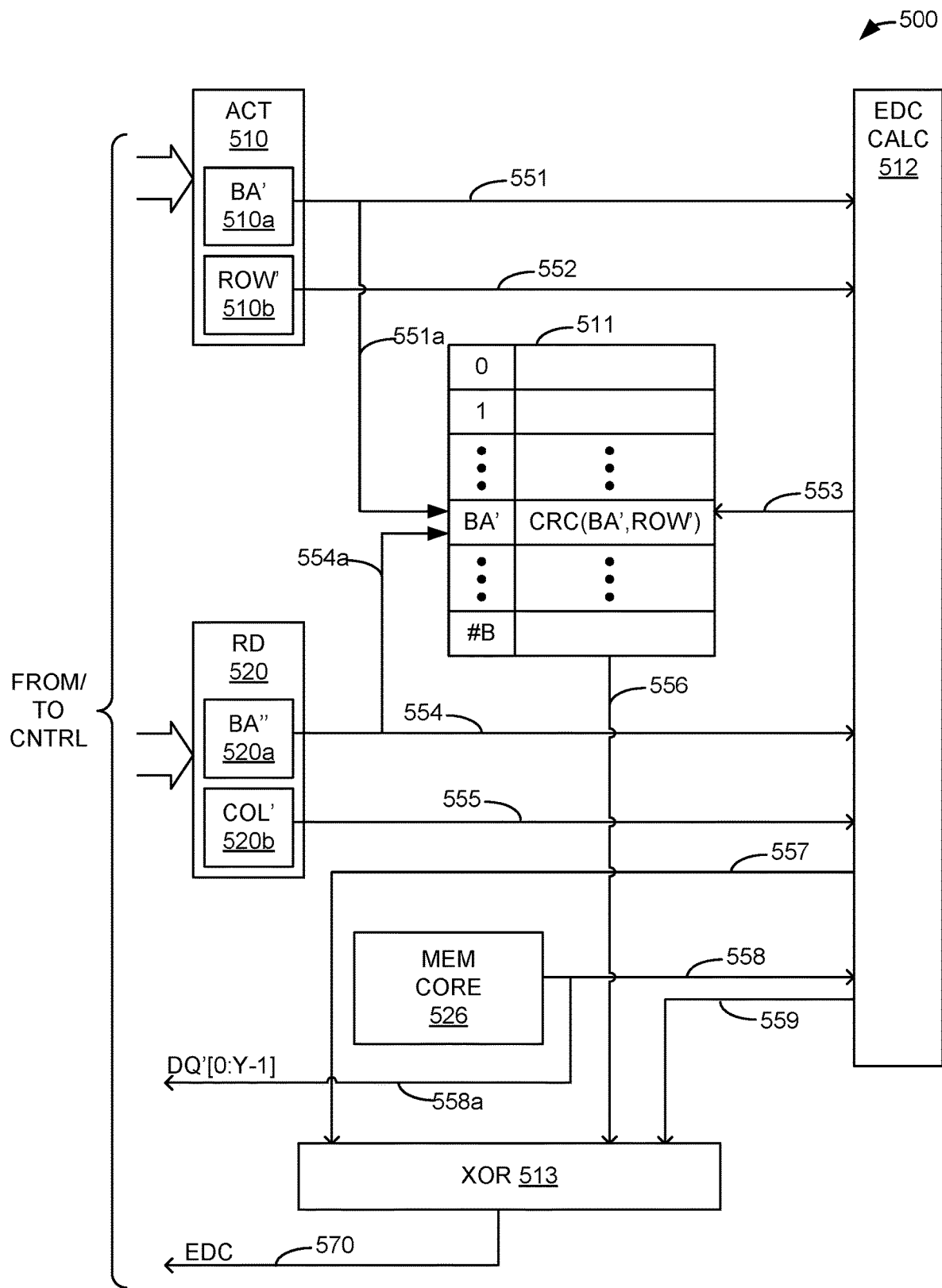
FIG. 5 is a diagram illustrating memory component actions performed for a read operation.

FIG. 5 is a diagram illustrating memory component actions performed for a read operation. In FIG. 5, memory component 500 comprises register file (a.k.a., memory elements) 511, error-detection code (EDC) calculation circuitry 512, exclusive-OR (XOR) 513 and memory core 526. Register file 511 has a storage location corresponding to each bank address value so that register file 511 can read/write entries using a bank address and an index (a.k.a., address).

Memory component 500 receives activate command information 510. Activate command information 510 may be received from, for example, controller 400. Activate command information 510 includes a received bank address (BA') value 510a and a received row address (ROW') value 510b.

Arrow 551 illustrates that received BA' value 510a is provided to EDC calculation circuitry 512. Arrow 552 illustrates that received ROW' value 510b is provided to EDC calculation circuitry 512. Based on received BA' value 510a and received ROW' value 510b, EDC calculation circuitry 512 generates a first CRC value, CRC(0,0,0,BA', ROW'). Arrow 553 illustrates that CRC(0,0,0,BA',ROW') is provided to, and stored in register file 511 at a location determined (indexed by) by received BA' value 510a (as illustrated by arrow 551a).

Memory component 500 receives read command information 520. Read command information 520 may be received from, for example, controller 400. Read command information 520 includes a second received bank address (BA") value 520a and a received column address (COL') value 520b. Arrow 554 illustrates that received BA" value 520a is provided to EDC calculation circuitry 512. Arrow 555 illustrates that received COL' value 520b is provided to EDC calculation circuitry 512.

In FIG. 5, BA" value 520a equals BA' value 510a such that BA" value 520a can be used to retrieve CRC(0,0,0,BA', ROW') from location BA' of register file 511. This is illustrated by arrow 554a which indexes to the same location in register file 511 as arrow 551a. Arrow 556 illustrates that the result of reading location BA" from register file 511 (i.e., stored value CRC(0,0,0,BA',ROW')) is provided to XOR 513.

Based on BA" value 520a and COL' value 520b, EDC calculation circuitry 512 generates a second CRC value, CRC(0,BA",COL',0,0). Arrow 557 illustrates that CRC(0, BA",COL',0,0) is provided to XOR 413.

In response to the read command information 520 received by the memory component 500, memory component 500 retrieves read data from memory core 526. Arrow 558 illustrates that the read data DQ' is provided to EDC calculation circuitry 512. The read data DQ' is also transmitted to a controller (e.g., controller 400.) This is illustrated in FIG. 5 by arrow 558a. Based on the read data DQ', EDC calculation circuitry 512 generates a third CRC value, CRC (DQ',0,0,0,0). Arrow 559 illustrates that CRC(DQ',0,0,0,0) is provided to XOR 513.

XOR 513 calculates CRC(0,0,0,BA',ROW')⊕CRC(0, BA",COL',0,0)⊕CRC(DQ',0,0,0,0). Because EDC calculation circuitry 512 generate an error-detection code that has the property of being linear with respect to the exclusive-OR (⊕) operation, CRC(0,0,0,BA',ROW')⊕CRC(0,BA",COL', 0,0)⊕CRC(DQ',0,0,0,0)=CRC(DQ', BA",COL', BA', ROW'). CRC(DQ', BA",COL', BA',ROW') is a CRC value that, when an error has not occurred, will be equal to a controller calculated CRC value, CRC(DQ, BA, COL, BA, ROW). Memory component 500 transmits the memory calculated CRC value, CRC(DQ', BA", COL', BA', ROW'). This is illustrated in FIG. 5 by arrow 570.

Figure 6:
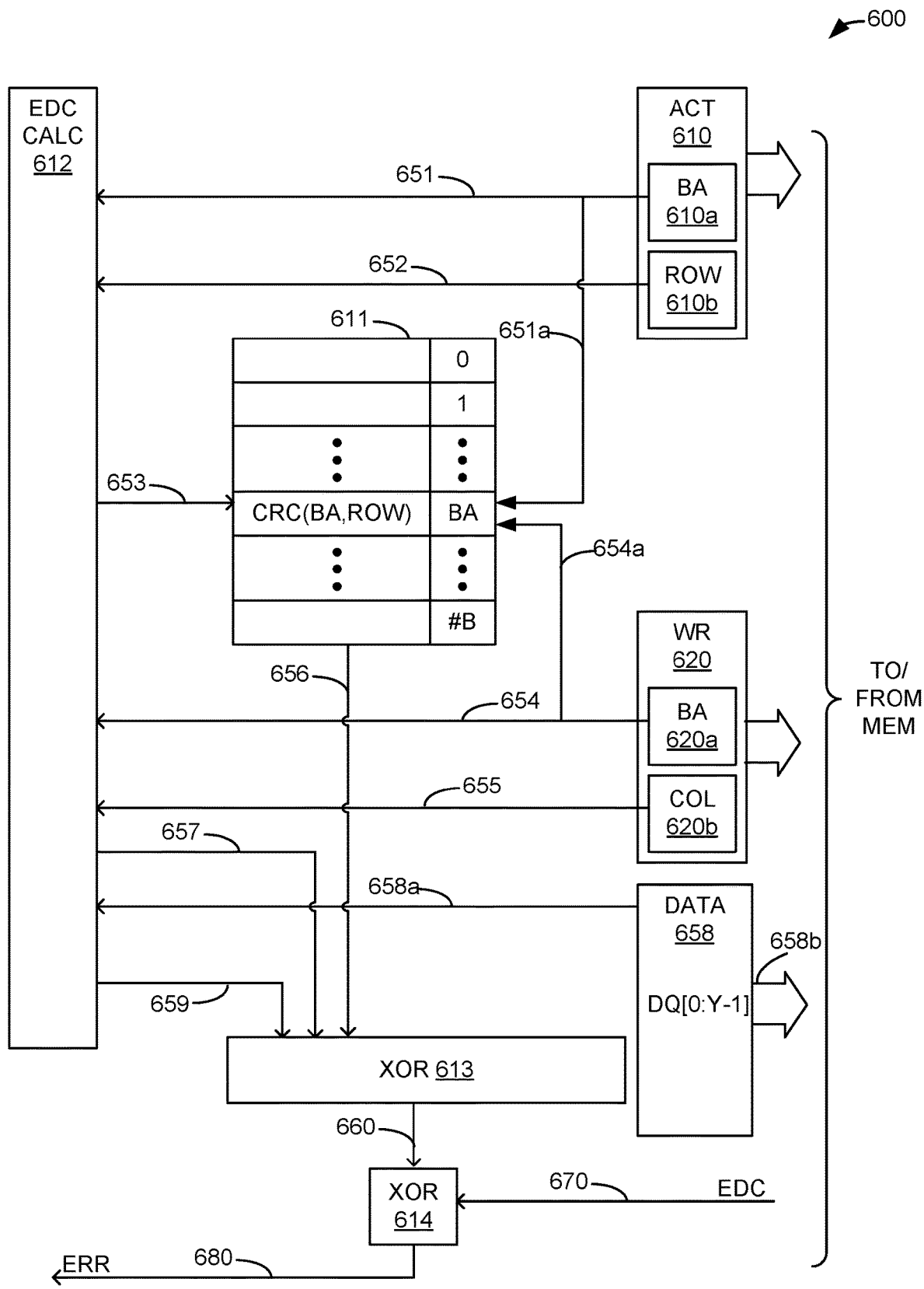
FIG. 6 is a diagram illustrating controller actions performed for a write operation.

FIG. 6 is a diagram illustrating controller actions performed for a write operation. In FIG. 6, controller 600 comprises register file (a.k.a., memory elements) 611, error-detection code (EDC) calculation circuitry 612, exclusive-OR (XOR) 613 and XOR 614. Register file 611 has a storage location corresponding to each bank address value so that register file 611 can read/write entries using a bank address and an index (a.k.a., address).

Controller 600 generates activate command information 610. Activate command information 610 includes a bank address (BA) value 610a and a row address value (ROW) 610b. Activate command information 610 is transmitted to a memory component.

Arrow 651 illustrates that BA value 610a is provided to EDC calculation circuitry 612. Arrow 652 illustrates that row address value 610b is provided to EDC calculation circuitry 612. Based on BA value 610a and ROW value 610b, EDC calculation circuitry 612 generates a first CRC value, CRC(0,0,0,BA,ROW). Arrow 653 illustrates that CRC(0,0,0,BA,ROW) is provided to, and stored in register file 611 at a location determined (indexed by) by bank address value 610a (as illustrated by arrow 651a).

Controller 600 generates write command information 620. Write command information 620 includes a bank address (BA) value 620a and a column address value (COL) 620b. Arrow 654 illustrates that BA value 620a is provided to EDC calculation circuitry 612. Arrow 655 illustrates that column address value 620b is provided to EDC calculation circuitry 612. Write command information 620 is transmitted to the memory component.

In FIG. 6, BA value 620*a* equals BA value 610*a* such that BA value 620*a* can be used to retrieve CRC(0,0,0,BA,ROW) from location BA of register file 611. This is illustrated by arrow 654*a* which indexes to the same location in register file 611 as arrow 651*a*. Arrow 656 illustrates that the result of reading location BA from register file 611 (i.e., stored value CRC(0,0,0,BA,ROW)) is provided to XOR 613.

Based on BA value 620*a* and column address value 620*b* EDC calculation circuitry 612 generates a second CRC value, CRC(0,BA,COL,0,0). Arrow 657 illustrates that CRC (0,BA,COL,0,0) is provided to XOR 613.

Because controller 600 is performing a write operation, controller 600 provides write data (DQ) 658 that is transmitted to the memory component (illustrated by arrow 658*b*.) Arrow 658*a* illustrates that the write data DQ is provided to EDC calculation circuitry 612. Based on the write data DQ, EDC calculation circuitry 612 generates a third CRC value, CRC(DQ,0,0,0,0). Arrow 659 illustrates that CRC(DQ,0,0,0,0) is provided to XOR 613.

XOR 613 calculates CRC(0,0,0,BA,ROW)⊕CRC(0,BA, COL,0,0)⊕CRC(DQ,0,0,0,0). Because EDC calculation circuitry 612 generate an error-detection code that has the property of being linear with respect to the exclusive-OR (⊕) operation, CRC(0,0,0,BA,ROW)⊕CRC(0,BA,COL,0, 0)⊕CRC(DQ,0,0,0,0)=CRC(DQ, BA,COL, BA,ROW). CRC(DQ, BA,COL, BA,ROW) is an expected CRC value that, when an error has not occurred, will be equal to a memory calculated CRC value, CRC(DQ', BA", COL', BA', ROW').

Controller 600 receives a memory calculated CRC value, CRC(DQ', BA", COL', BA', ROW'), in response to the write command information 620 and the data 658 that was transmitted to the memory component. Arrow 670 illustrates that the memory calculated CRC value is provided to XOR 614. The expected CRC value CRC(DQ, BA,COL, BA,ROW) is bitwise XOR'd with CRC(DQ', BA", COL', BA', ROW') by XOR 614. This XOR operation effectively performs a bitwise comparison of the two CRC values.

If the expected CRC value CRC(DQ, BA,COL, BA,ROW) equals the memory calculated CRC value, CRC (DQ', BA", COL', BA', ROW'), then XOR 614 indicates to controller 600 that no error has occurred. If the expected CRC value CRC(DQ, BA,COL, BA,ROW) does not equal the memory calculated CRC value, CRC(DQ', BA", COL', BA', ROW'), then XOR 614 indicates to controller 600 that an error has occurred. This is illustrated in FIG. 6 by arrow 680.

Figure 7:
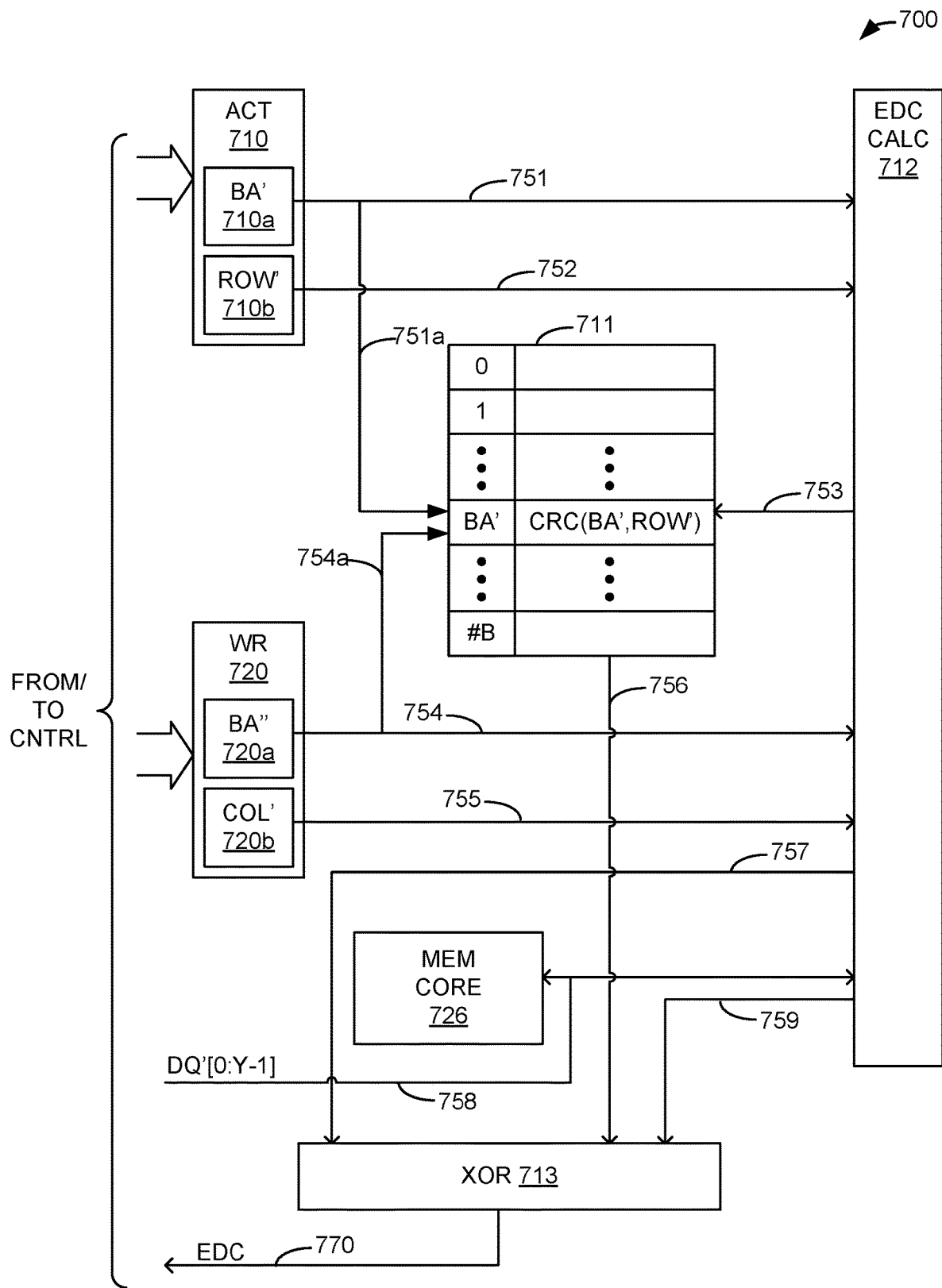
FIG. 7 is a diagram illustrating memory component actions performed for a write operation.

FIG. 7 is a diagram illustrating memory component actions performed for a write operation. In FIG. 7, memory component 700 comprises register file (a.k.a., memory elements) 711, error-detection code (EDC) calculation circuitry 712, exclusive-OR (XOR) 713 and memory core 726. Register file 711 has a storage location corresponding to each bank address value so that register file 711 can read/write entries using a bank address and an index (a.k.a., address).

Memory component 700 receives activate command information 710. Activate command information 710 may be received from, for example, controller 600. Activate command information 710 includes a received bank address (BA') value 710*a* and a received row address (ROW') value 710*b*.

Arrow 751 illustrates that received BA' value 710*a* is provided to EDC calculation circuitry 712. Arrow 752 illustrates that received ROW' value 710*b* is provided to EDC calculation circuitry 712. Based on received BA' value 710*a* and received ROW' value 710*b*, EDC calculation circuitry 712 generates a first CRC value, CRC(0,0,0,BA', ROW'). Arrow 753 illustrates that CRC(0,0,0,BA',ROW') is provided to, and stored in register file 711 at a location determined (indexed by) by received BA' value 710*a* (as illustrated by arrow 751*a*).

Memory component 700 receives write command information 720. Write command information 720 may be received from, for example, controller 600. Write command information 720 includes a second received bank address (BA") value 720*a* and a received column address (COL') value 720*b*. Arrow 754 illustrates that received BA" value 720*a* is provided to EDC calculation circuitry 712. Arrow 755 illustrates that received COL' value 720*b* is provided to EDC calculation circuitry 712.

In FIG. 7, BA" value 720*a* equals BA' value 710*a* such that BA" value 720*a* can be used to retrieve CRC(0,0,0,BA', ROW') from location BA' of register file 711. This is illustrated by arrow 754*a* which indexes to the same location in register file 711 as arrow 751*a*. Arrow 756 illustrates that the result of reading location BA" from register file 711 (i.e., stored value CRC(0,0,0,BA',ROW')) is provided to XOR 713.

Based on BA" value 720*a* and COL' value 720*b*, EDC calculation circuitry 712 generates a second CRC value, CRC(0,BA",COL',0,0). Arrow 757 illustrates that CRC(0, BA",COL',0,0) is provided to XOR 713.

Because memory component 700 is being controlled to perform a write operation, memory component receives write data, DQ'. Memory component 700 stores received write data DQ' in memory core 726. Arrow 758 illustrates that the received write data DQ' is provided to EDC calculation circuitry 712. Based on the received write data DQ', EDC calculation circuitry 712 generates a third CRC value, CRC(DQ',0,0,0,0). Arrow 759 illustrates that CRC(DQ',0,0, 0,0) is provided to XOR 713.

XOR 713 calculates CRC(0,0,0,BA',ROW')⊕CRC(0, BA",COL',0,0)⊕CRC(DQ',0,0,0,0). Because EDC calculation circuitry 712 generate an error-detection code that has the property of being linear with respect to the exclusive-OR (⊕) operation, CRC(0,0,0,BA',ROW')⊕CRC(0,BA",COL', 0,0)⊕CRC(DQ',0,0,0,0)=CRC(DQ', BA",COL', BA', ROW'). CRC(DQ', BA",COL', BA',ROW') is a CRC value that, when an error has not occurred, will be equal to a controller calculated CRC value, CRC(DQ, BA, COL, BA, ROW). Memory component 700 transmits the memory calculated CRC value, CRC(DQ', BA", COL', BA', ROW'). This is illustrated in FIG. 7 by arrow 770.

Figure 8:
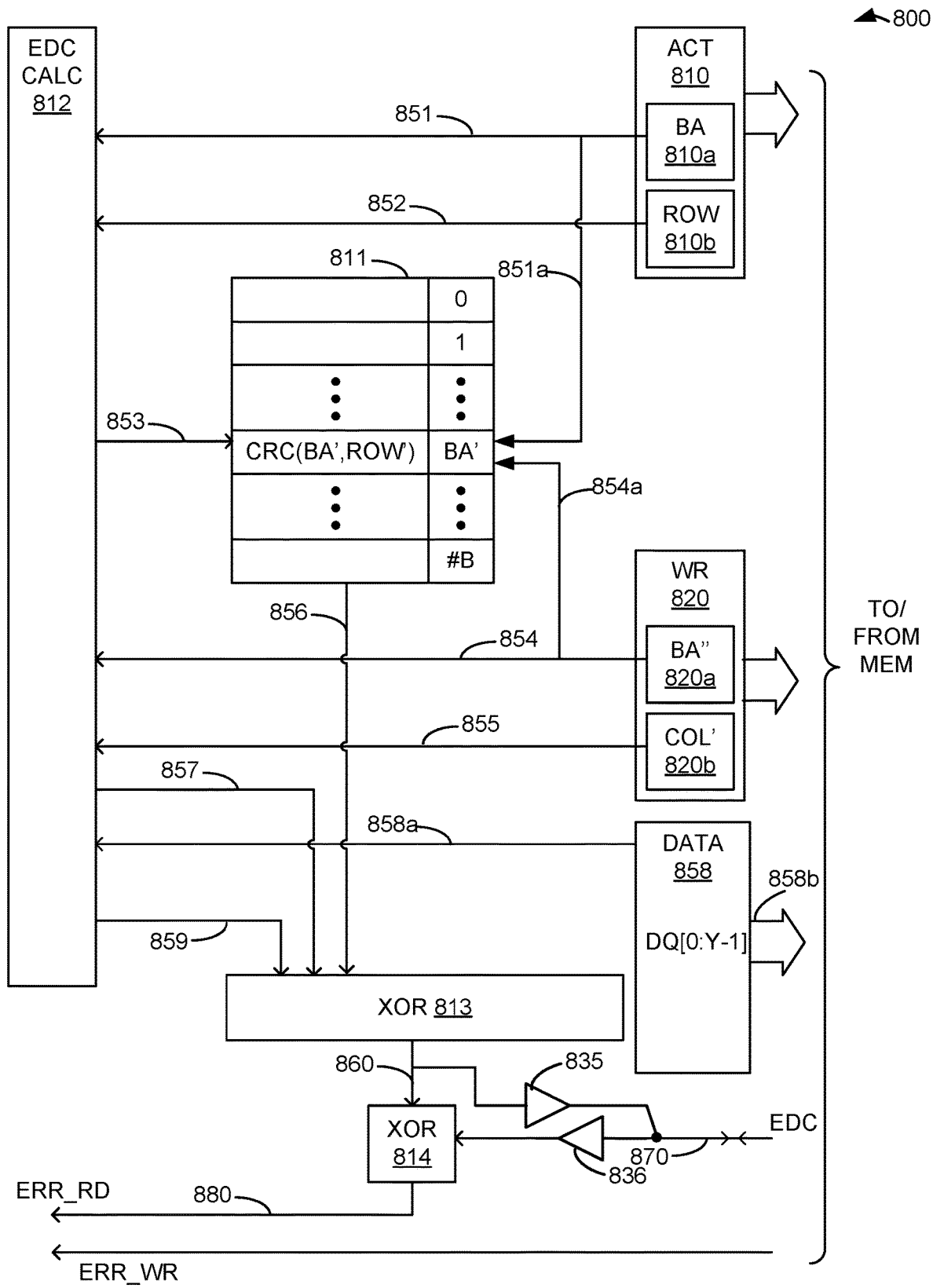
FIG. 8 is a diagram illustrating controller actions performed for a write operation to a memory component that checks an error-detecting code.

FIG. 8 is a diagram illustrating controller actions performed for a write operation to a memory component that checks an error-detecting code. In FIG. 8, controller 800 comprises register file (a.k.a., memory elements) 811, error-detection code (EDC) calculation circuitry 812, exclusive-OR (XOR) 813, XOR 814, EDC transmitter 835, and EDC receiver 836. Register file 811 has a storage location corresponding to each bank address value so that register file 811 can read/write entries using a bank address and an index (a.k.a., address).

Controller 800 generates activate command information 810. Activate command information 810 includes a bank address (BA) value 810*a* and a row address value (ROW) 810*b*. Activate command information 810 is transmitted to a memory component.

Arrow 851 illustrates that BA value 810*a* is provided to EDC calculation circuitry 812. Arrow 852 illustrates that row address value 810*b* is provided to EDC calculation circuitry 812. Based on BA value 810*a* and ROW value 810*b*, EDC calculation circuitry 812 generates a first CRC value, CRC(0,0,0,BA,ROW). Arrow 853 illustrates that CRC(0,0,0,BA,ROW) is provided to, and stored in register file 811 at a location determined (indexed by) by bank address value 810a (as illustrated by arrow 851a).

Controller 800 generates write command information 820. Write command information 820 includes a bank address (BA) value 820a and a column address value (COL) 820b. Arrow 854 illustrates that BA value 820a is provided to EDC calculation circuitry 812. Arrow 855 illustrates that column address value 820b is provided to EDC calculation circuitry 812. Write command information 820 is transmitted to the memory component.

In FIG. 8, BA value 820a equals BA value 810a such that BA value 820a can be used to retrieve CRC(0,0,0,BA,ROW) from location BA of register file 811. This is illustrated by arrow 854a which indexes to the same location in register file 811 as arrow 851a. Arrow 856 illustrates that the result of reading location BA from register file 811 (i.e., stored value CRC(0,0,0,BA,ROW)) is provided to XOR 813.

Based on BA value 820a and column address value 820b EDC calculation circuitry 812 generates a second CRC value, CRC(0,BA,COL,0,0). Arrow 857 illustrates that CRC (0,BA,COL,0,0) is provided to XOR 813.

Because controller 800 is performing a write operation, controller 800 provides write data (DQ) 858 that is transmitted to the memory component (illustrated by arrow 858b.) Arrow 858a illustrates that the write data DQ is provided to EDC calculation circuitry 812. Based on the write data DQ, EDC calculation circuitry 812 generates a third CRC value, CRC(DQ,0,0,0,0). Arrow 859 illustrates that CRC(DQ,0,0,0,0) is provided to XOR 813.

XOR 813 calculates CRC(0,0,0,BA,ROW)⊕CRC(0,BA,COL,0,0)⊕CRC(DQ,0,0,0,0). Because EDC calculation circuitry 812 generate an error-detection code that has the property of being linear with respect to the exclusive-OR (⊕) operation, CRC(0,0,0,BA,ROW)⊕CRC(0,BA,COL,0,0)⊕CRC(DQ,0,0,0,0)=CRC(DQ, BA,COL, BA,ROW). CRC(DQ, BA,COL, BA,ROW) is an expected CRC value that, when an error has not occurred, will be equal to a memory calculated CRC value, CRC(DQ', BA", COL', BA', ROW').

Controller 800 transmits, using transmitter 835, controller calculated CRC value, CRC(DQ, BA, COL, BA, ROW). Arrow 870 illustrates that controller calculated CRC value is transmitted to the memory component. Controller 800 may receive a signal (e.g., ERR_WR) from the memory component indicating whether the memory component has detected that an error has occurred. It should be understood that for read operations, controller 800 may receive a memory calculated CRC value CRC(DQ', BA", COL', BA', ROW') via receiver 836.

Figure 9:
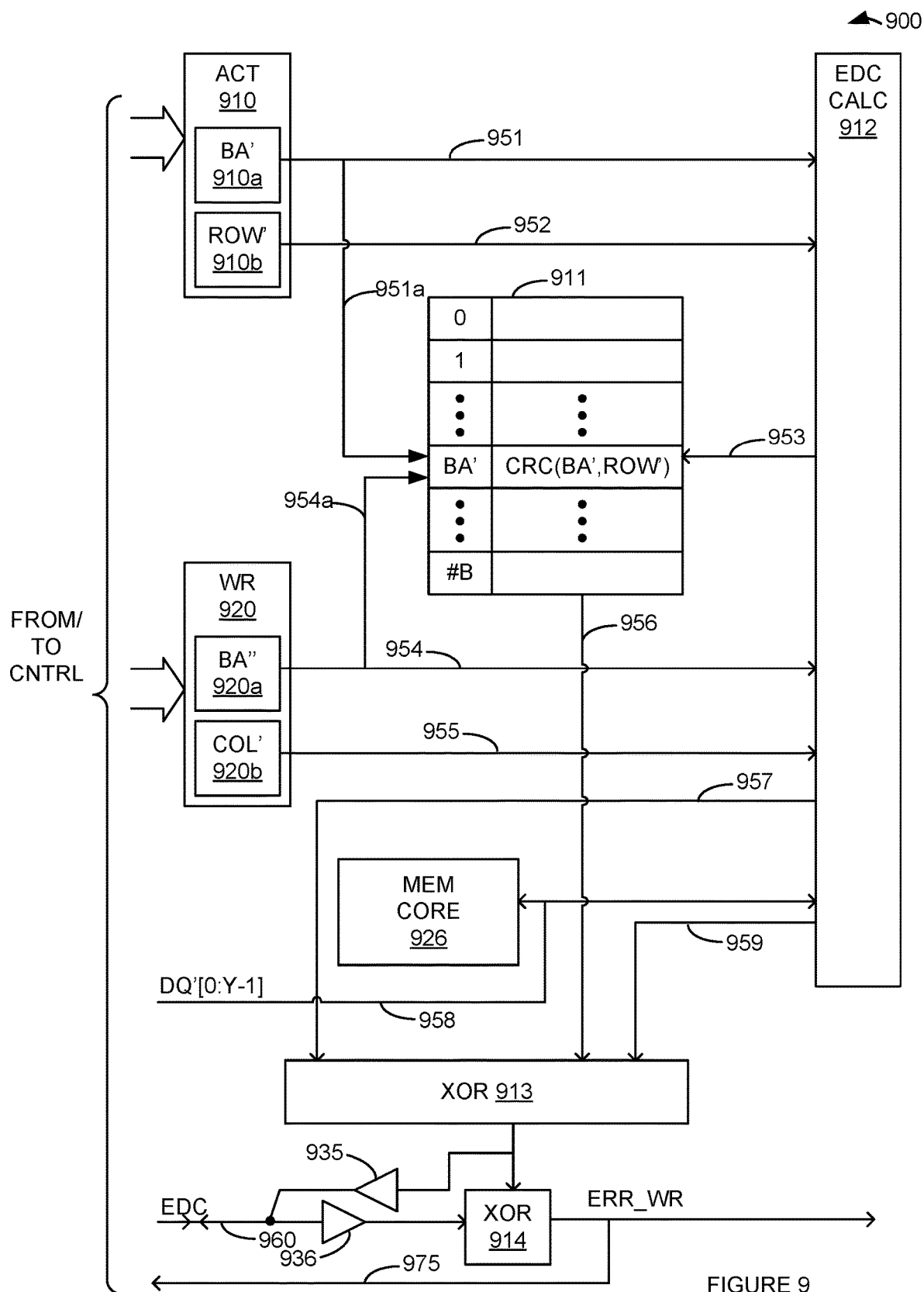
FIG. 9 is a diagram illustrating memory component actions performed for a write operation and checking of an error-detecting code.

FIG. 9 is a diagram illustrating memory component actions performed for a write operation and checking of an error-detecting code. In FIG. 9, memory component 900 comprises register file (a.k.a., memory elements) 911, error-detection code (EDC) calculation circuitry 912, exclusive-OR (XOR) 913, memory core 926, transmitter 935, and receiver 936. Register file 911 has a storage location corresponding to each bank address value so that register file 911 can read/write entries using a bank address and an index (a.k.a., address).

Memory component 900 receives activate command information 910. Activate command information 910 may be received from, for example, controller 800. Activate command information 910 includes a received bank address (BA') value 910a and a received row address (ROW') value 910b.

Arrow 951 illustrates that received BA' value 910a is provided to EDC calculation circuitry 912. Arrow 952 illustrates that received ROW' value 910b is provided to EDC calculation circuitry 912. Based on received BA' value 910a and received ROW' value 910b, EDC calculation circuitry 912 generates a first CRC value, CRC(0,0,0,BA',ROW'). Arrow 953 illustrates that CRC(0,0,0,BA',ROW') is provided to, and stored in register file 911 at a location determined (indexed by) by received BA' value 910a (as illustrated by arrow 951a).

Memory component 900 receives write command information 920. Write command information 920 may be received from, for example, controller 800. Write command information 920 includes a second received bank address (BA") value 920a and a received column address (COL') value 920b. Arrow 954 illustrates that received BA" value 920a is provided to EDC calculation circuitry 912. Arrow 955 illustrates that received COL' value 920b is provided to EDC calculation circuitry 912.

In FIG. 9, BA" value 920a equals BA' value 910a such that BA" value 920a can be used to retrieve CRC(0,0,0,BA',ROW') from location BA' of register file 911. This is illustrated by arrow 954a which indexes to the same location in register file 911 as arrow 951a. Arrow 956 illustrates that the result of reading location BA" from register file 911 (i.e., stored value CRC(0,0,0,BA',ROW')) is provided to XOR 913.

Based on BA" value 920a and COL' value 920b, EDC calculation circuitry 912 generates a second CRC value, CRC(0,BA",COL',0,0). Arrow 957 illustrates that CRC(0,BA",COL',0,0) is provided to XOR 913.

Because memory component 900 is being controlled to perform a write operation, memory component receives write data, DQ'. Memory component 900 stores received write data DQ' in memory core 926. Arrow 958 illustrates that the received write data DQ' is provided to EDC calculation circuitry 912. Based on the received write data DQ', EDC calculation circuitry 912 generates a third CRC value, CRC(DQ',0,0,0,0). Arrow 959 illustrates that CRC(DQ',0,0,0,0) is provided to XOR 913.

XOR 913 calculates CRC(0,0,0,BA',ROW')⊕CRC(0,BA",COL',0,0)⊕CRC(DQ',0,0,0,0). Because EDC calculation circuitry 912 generate an error-detection code that has the property of being linear with respect to the exclusive-OR (⊕) operation, CRC(0,0,0,BA',ROW')⊕CRC(0,BA",COL',0,0)⊕CRC(DQ',0,0,0,0)=CRC(DQ', BA",COL', BA', ROW'). CRC(DQ', BA",COL', BA',ROW') is a CRC value that, when an error has not occurred, will be equal to a controller calculated CRC value, CRC(DQ, BA, COL, BA, ROW).

Memory component 900 receives a controller calculated CRC value, CRC(DQ, BA, COL, BA, ROW), in response to the write command information 920 that was transmitted to the memory component. Arrow 960 illustrates that the controller calculated CRC value is provided to XOR 914 via receiver 936. The received CRC value CRC(DQ, BA,COL, BA,ROW) is bitwise XOR'd with expected CRC(DQ', BA", COL', BA', ROW') by XOR 914. This XOR operation effectively performs a bitwise comparison of the two CRC values.

If the received CRC value CRC(DQ, BA,COL, BA,ROW) equals the expected calculated CRC value, CRC(DQ', BA", COL', BA', ROW'), then XOR 914 indicates to memory component 900 that no error has occurred. If the received CRC value CRC(DQ, BA,COL, BA,ROW) does not equal the memory calculated CRC value, CRC(DQ', BA", COL', BA', ROW'), then XOR 914 indicates to memory component 900 that an error has occurred. This is illustrated in FIG. 9 by the signal ERR_WR. The indicator of whether an error has occurred may be transmitted to the controller. This is illustrated in FIG. 9 by arrow 975.

In an embodiment, if XOR 914 indicates an error has occurred, then memory component 900 aborts the write operation (i.e., does not store the write data to memory core 926.) By not performing the write operation when an error has been detected, memory component avoids the possibility of writing (and thereby overwriting) data at an unintended (i.e., erroneous/corrupted) location in a bank of memory core 926.

Figure 10:
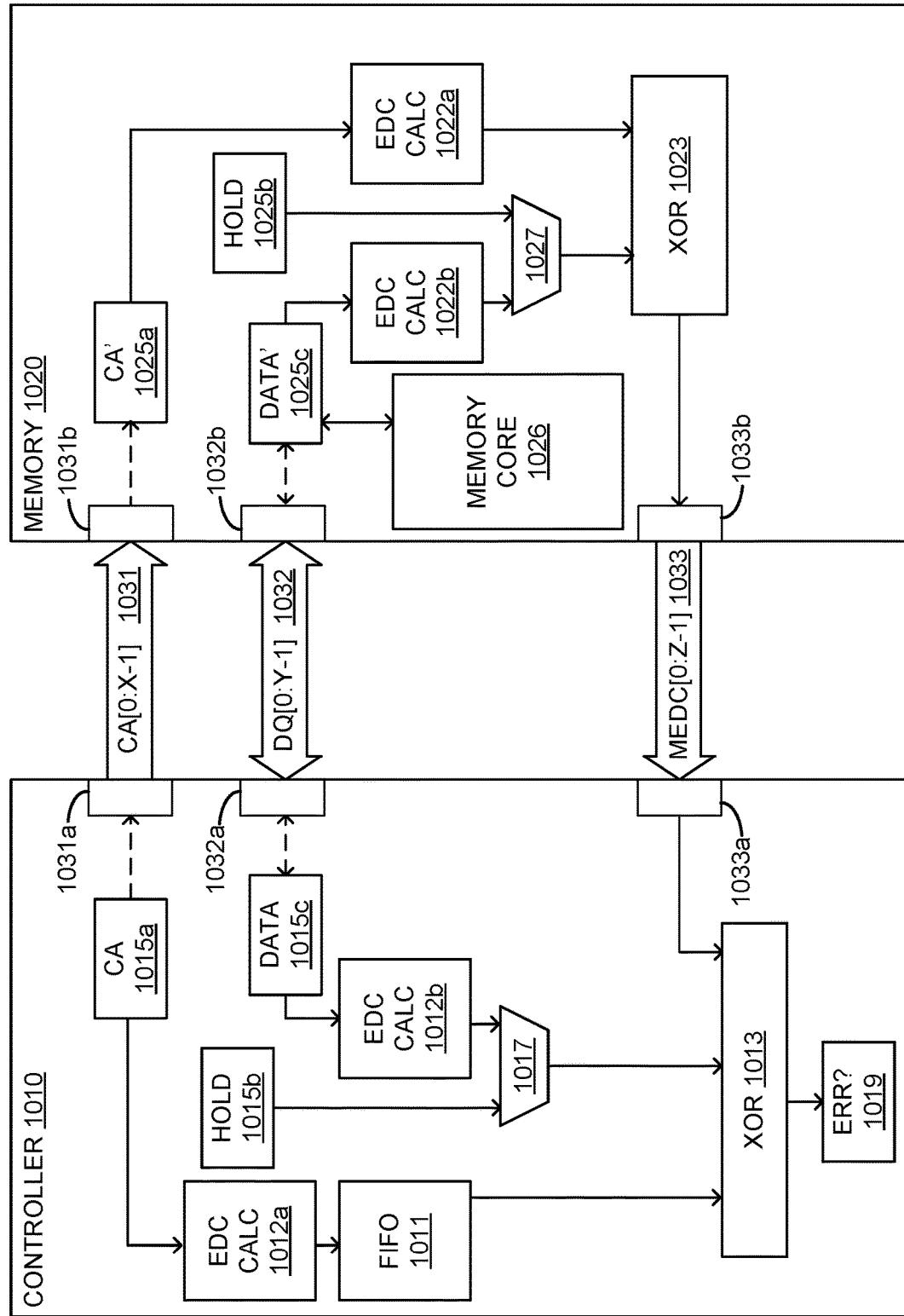
FIG. 10 is a diagram illustrating a memory system that checks an error-detecting code applied to the command/address communications.

FIG. 10 is a diagram illustrating a memory system that checks an error-detecting code applied to the command/address communications. In FIG. 10, memory system 1000 comprises controller 1010 and memory component 1020. Controller 1010 includes first-in first-out (FIFO) buffer 1011, error-detection code (EDC) calculation circuitry 1012a, EDC calculation circuitry 1012b, exclusive-OR (XOR) 1013, selector (multiplexor—MUX) 1017, error indicator 1019, command/address (CA) interface 1031a, data (DQ) interface 1032a, and modulated error-detection code (MEDC) interface 1033a.

Memory component 1020 includes EDC calculation circuitry 1022a, EDC calculation circuitry 1022b, XOR 1023, selector (MUX) 1027, memory core (e.g., storage cell array) 1026, CA interface 1031b, DQ interface 1032b, and MEDC interface 1033b.

Controller 1010 is operatively coupled to memory 1020 via CA interface 1031a that is coupled to CA signal lines 1031. CA signal lines 1031 (and corresponding CA interface 1031a on controller 1010 and CA interface 1031b on memory component 1020) may be composed of X number of signal lines. In an embodiment, X=11. In an embodiment, CA signal lines 1031 may include one or more (e.g., 1) data bus inversion (DBI) signal lines. Controller 1010 is operatively coupled to memory 1020 to send commands and associated information (e.g., addresses) to memory 1020 via CA signal lines 1031. Memory 1020 receives these commands (and associated information—e.g., addresses) via CA interface 1031b that is also coupled to CA signal lines 1031.

Controller 1010 is operatively coupled to memory 1020 via DQ interface 1032a that is coupled to DQ signal lines 1032. DQ signal lines 1032 (and corresponding DQ interface 1032a on controller 1010 and DQ interface 1032b on memory component 1020) may be composed of Y number of signal lines. In an embodiment, Y=18. In an embodiment, DQ signal lines 1032 may include one or more (e.g., 2) DBI signal lines. Controller 1010 and memory component 1020 are operatively coupled via DQ signal lines 1032 to bidirectionally communicate data. Memory 1020 may store (e.g., in memory core 1026) and retrieve (e.g., from memory core 1026) data communicated via DQ interface 1032b and DQ signal lines 1032.

Memory 1020 is operatively coupled to controller 1010 via MEDC interface 1033b that is coupled to MEDC signal lines 1033. MEDC signal lines 1033 (and corresponding MEDC interface 1033a on controller 1010 and EDC interface 1033b on memory component 1020) may be composed of Z number of signal lines. In an embodiment, Z=2. In an embodiment, EDC signal lines 1033 may include one or more (e.g., 1) DBI signal lines. Memory 1020 is operatively coupled to controller 1010 to send error-detection code information (e.g., EDC code bits) to controller 1010 via MEDC interface 1033b and MEDC signal lines 1033. Controller 1010 receives these MEDC bits via MEDC interface 1033a and MEDC signal lines 1033.

In an embodiment, controller 1010 sends, via CA signal lines 1031, command/address information (CA) 1015a. Command/address information 1015a is also provided to EDC calculation circuitry 1022a. EDC calculation circuitry 1022a calculates a first error detecting code value that is stored in FIFO buffer 1011. FIFO buffer 1011 allows controller 1010 to synchronize the first error detecting code value with the reception (e.g., by interface 1033a) of a second error detecting code value from memory 1020.

Memory 1020 receives, via CA signal lines 1031, command/address information (CA') 1025a. Typically, received command/address information 1025a should be the same as transmitted command/address information 1015a. However, transmitted command/address information 1015a may be corrupted by the time it is received by memory 1020 as received command/address information 1025a. Received command/address information 1025a is also provided to EDC calculation circuitry 1022a. EDC calculation circuitry 1022a calculates a second error detecting code value. This second EDC value is provided to XOR 1023.

Concurrently with sending command/address information 1015a, controller 1010 may be sending or receiving data 1015c via DQ interface 1032a. Controller 1010 provides data 1015c to EDC calculation circuitry 1012b. EDC calculation circuitry 1012b provides a third EDC value to selector 1017. Selector 1017 selects between the output of data EDC calculation circuitry 1012b and a hold value 1015b. The output of selector 1017 is provided to XOR 1013. The output of XOR 1013 is an error indicator 1019.

Likewise, concurrently with receiving command/address information 1025a, memory 1020 may be sending or receiving data 1025c via DQ interface 1032b. Memory 1020 provides data 1025c to EDC calculation circuitry 1022b. EDC calculation circuitry 1022b provides a fourth EDC value to selector 1027. Selector 1027 selects between the output EDC calculation circuitry 1022b and a hold value 1025b. The output of selector 1027 is provided to XOR 1023. The output of XOR 1023 is provided to MEDC interface 1033a.

EDC calculation circuitry 1012a calculates an expected EDC code value (e.g., parity or CRC) from the CA information 1015a sent to memory 1020. Controller 1010 writes the expected EDC code value into FIFO (queue) 1011. FIFO 1011 has a depth that compensates for the round trip latency of controller 1010, CA interface 1031a, CA signal lines 1031, CA interface 1031b, EDC calculation circuitry 1022a, XOR 1023, MEDC interface 1033b, MEDC signal lines 1033, and MEDC interface 1033a.

EDC calculation circuitry 1022a calculates a memory calculated EDC code value from the received CA information 1025a. When data is not being transferred via DQ signal lines 1032, selector 1027 couples hold pattern 1025b to XOR 1023. When data is being transferred via DQ signal lines 1032, selector 1027 couples the data EDC code value calculated by EDC calculation circuitry 1022b to XOR 1023. Thus, the CA information EDC code value calculated by EDC calculation circuitry 1022a conditionally inverts one or more bits (by operation of XOR 1023) of the output from selector 1027 (i.e., either the hold pattern 1025b or the data EDC value). This conditionally inverted (a.k.a., modulated) output from selector 1027 is transmitted by memory 1020 to controller 1010 via MEDC signal lines 1033. Because there is typically a delay between the reception of CA information and the corresponding data and data EDC value transmission associated with that CA information, the CA information EDC code value modulates a data EDC value that is associated with different CA information. In other words, the data EDC value associated with a first command/address is modulated by the CA information EDC code value associated with a second (and different) command.

When data is not being transferred via DQ signal lines 1032, selector 1017 couples hold pattern 1015*b* to XOR 1013. When data is being transferred via DQ signal lines 1032, selector 1017 couples the output of data EDC calculation circuitry 1012*b* to XOR 1013. Thus, the CA information EDC code value from FIFO 1011 effectively inverts one or more bits (by operation of XOR 1013) of the output from selector 1017 (i.e., either the hold pattern 1025*b* or the data EDC value from EDC calculation circuitry 1012*b*). If the CA information EDC code value from FIFO 1011 matches the corresponding CA information EDC code value calculated by EDC calculation circuitry 1022*a*, then XOR 1013 selectively inverts the output from selector 1017 in the same manner that XOR 1023 selectively inverted the bits from selector 1027. Thus, XOR 1013 compares the effectively modulated bits to the received modulated EDC value from memory 1020. A mis-compare (non-zero) output from XOR 1013 indicates that an error occurred in either the command/address information transmission or a data transmission. When an error has occurred in either the command/address information transmission or a data transmission, controller 1010 may take remedial action (e.g., retry one or more commands and/or retry one or more data/information transfers.

In an embodiment, CA interface 1031*b* receives, from controller 1010, command and address information. This command and address information includes a first received command. Data is communicated with controller 1010 via DQ interface 1032*b*. The data is communicated with controller 1010 via DQ interface 1032*b* may be associated with a second received command. Error detection code (EDC) calculation circuitry 1022*a* calculates a first EDC value based on the first received command. EDC calculation circuitry 1022*b* calculates a second EDC value based on data communicated via DQ interface 1032*b*.

XOR 1023 calculates an EDC transmit value using an invertible function (i.e., XOR) that is based on the first EDC value and a value selected by MUX 1027. MUX 1027 selects between an EDC value calculated by EDC calculation circuitry 1022*b* and a hold value 1025*b*. The EDC transmit value is transmitted to controller 1010 via MEDC interface 1033*b*.

In an embodiment, the first received command and the second received command communicate data via DQ interface 1032*b* during different time allocations. XOR 1023 may perform a bitwise exclusive-OR of at least one, less than all, or all, of the first EDC value with a corresponding at least one, less than all, or all, the selected value. Hold value 1025*b* may be sourced from a register. MUX 1027 may select hold value 1025*b* for commands that are not associated with communicating data via DQ interface 1032*b*.

In an embodiment, CA interface 1031*a* transmits, to memory component 1020, command and address information. This command and address information includes a first command. Data associated with a second command is communicated via DQ interface 1032*a*. Error detection code (EDC) calculation circuitry 1012*a* calculates a first EDC value that is based on the command and address information. Error detection code (EDC) calculation circuitry 1012*b* calculates a second EDC value based the data associated with the second command that is communicated via DQ interface 1032*a*. FIFO 1011 is used to store the first EDC value.

XOR 1013 calculates an expected EDC value using an invertible function (i.e., XOR) that is based on the first EDC value received from FIFO 1011 and a value selected by MUX 1017. MUX 1027 selects between an EDC value calculated by EDC calculation circuitry 1012*b* and a hold value 1015*b*. MEDC interface 1033*a* receives a memory component 1020 calculated EDC transmit value. XOR 1013, based on the expected EDC value and the received memory component 1020 calculated EDC transmit value, determines whether an error has occurred.

In an embodiment, the first command and the second command communicate data via DQ interface 1032*a* during different time allocations. XOR 1013 may perform a bitwise exclusive-OR of at least one, less than all, or all, of the expected EDC value with a corresponding at least one, less than all, or all, the selected value. Hold value 1015*b* may be sourced from a register. MUX 1017 may select hold value 1015*b* for commands that are not associated with communicating data via DQ interface 1032*a*.

It should be understood that the selective application of the invertible function in the generation of the EDC transmit value is used to convey information from memory component 1020 to controller 1010. In FIG. 10, at least some of the information conveyed is the first EDC value (or parity) calculated by memory component. When additional bits are available for 'modulation' with the invertible function (e.g., when less than all of the of the bits being transmitted via MEDC interface 1033 are subject to 'modulation'), additional information may be conveyed using these additional bits. For example, the ERR_WR signal 870 of FIG. 8 and/or the ERR_WR signal 970 of FIG. 9 could be conveyed using the selective application of the invertible function to one or more bits of the CRC values communicated by controller 800 and/or memory component 900.

Figure 11:
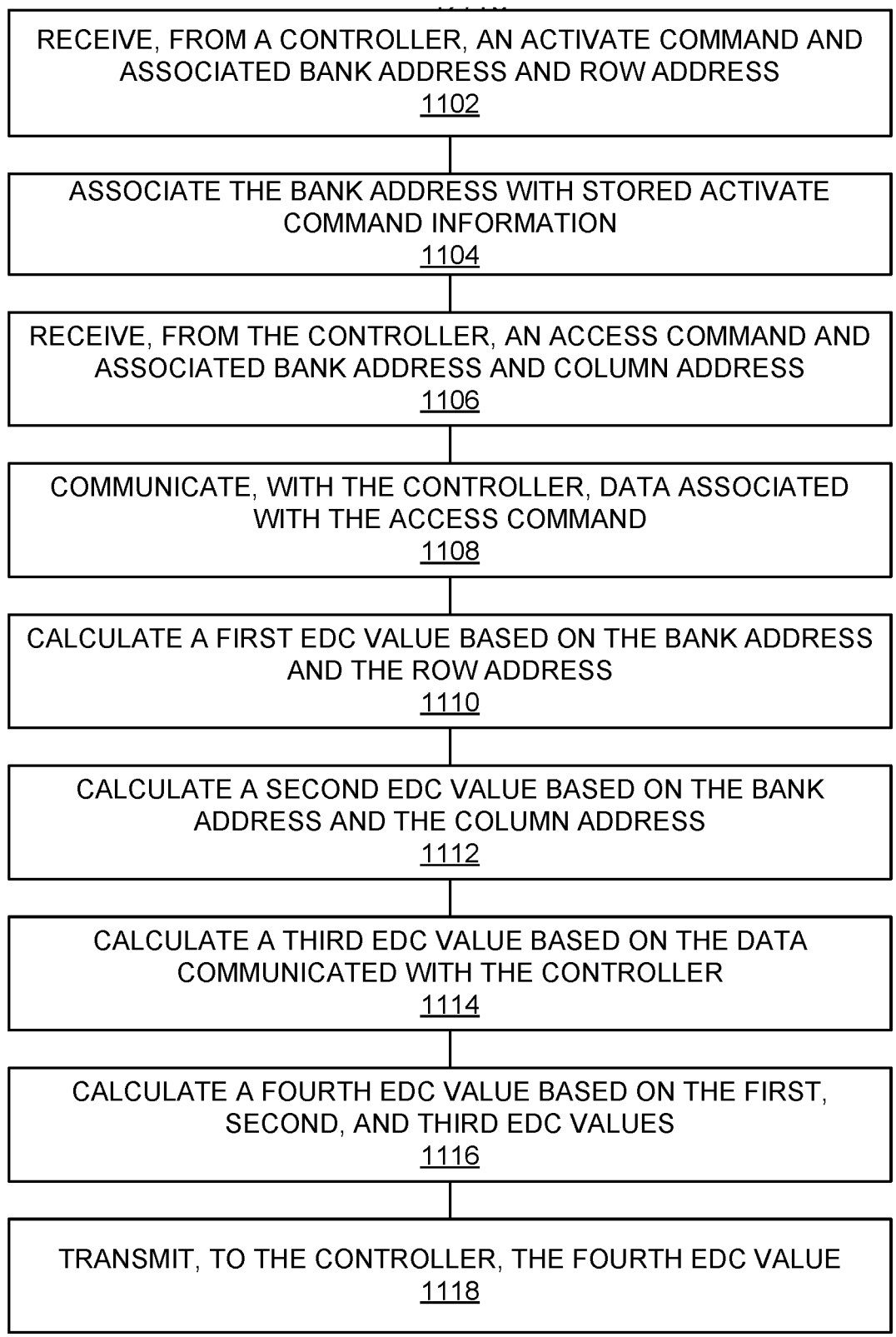
FIG. 11 is a flowchart illustrating a memory component access.

FIG. 11 is a flowchart illustrating a memory component access. The steps illustrated in FIG. 11 may be performed by one or more of elements of memory system 100, memory system 200, memory component 500, memory component 700, memory component 900, and/or memory system 1000. From a controller, an activate command and associated bank address and row address are received (1102). For example, memory component 500 may receive (e.g., from controller 400), activate command 510 that includes bank address BA' 510*a* and row address ROW' 510*b*.

The bank address is associated with stored activate command information (1104). For example, memory component 500 may store, in register file 511, a CRC value calculated based on at least BA' value 510*a* and ROW' value 510*b*. This CRC value (e.g., CRC(BA', ROW')) may be stored in an entry in register file 511 that corresponds to (e.g., is index by) bank address BA' value 510*a*. In this manner, the CRC value is associated with the BA' value 510*a* by virtue of the location in which the CRC value is stored in register file 511. In another example, memory component 500 may store, in register file 511, the ROW' value 510*b* in the entry in register file 511 that corresponds to (e.g., is index by) bank address BA' value 510*a*. In another example, memory component 500 may store, in register file 511, both the BA' value 510*a* and the ROW' value 510*b* in the entry in register file 511 that corresponds to (e.g., is index by) bank address BA' value 510*a*. In the latter two examples, the CRC value (e.g., CRC(BA', ROW')) can be calculated from the stored contents at the location corresponding to BA' value 510*a* in register file 511.

From the controller, an access command and associated bank address and column address are received (1106). For example, memory component 500 may receive (e.g., from controller 400), read command 520 that includes bank address BA" value 520*a* and column address COL' value 520*b*. Data associated with the access command is communicated with the controller (1108). For example, memory component 500 may communicate to controller 400 data read from memory core 526. In another example, memory component 500 may receive data from controller 400 to be stored in memory core 526.

A first EDC value based on the bank address and the row address is calculated (1110). For example, EDC calculation circuitry 512 may calculate CRC(0,0,0,BA',ROW'). EDC calculation circuitry 512 may calculate CRC(0,0,0,BA', ROW') based on a BA' value 510*a* and/or ROW' value 510*b* received from register file 511. EDC calculation circuitry 512 may calculate CRC(0,0,0,BA',ROW') based on BA' value 510*a* and/or ROW' value 510*b* received from controller 400. Memory component 500 may store CRC(0,0,0,BA', ROW') in register file 511, indexed by the BA' value 510*a*.

A second EDC value based on the bank address and the column address is calculated (1112). For example, EDC calculation circuitry 512 may calculate CRC(0,BA",COL', 0,0) based on BA" value 520*a* and COL' value 520*b* received from controller 400. A third EDC value is calculated based on the data communicated with the controller (1114). For example, EDC calculation circuitry 512 may calculate CRC (DQ',0,0,0,0).

A fourth EDC value based on the first, second, and third EDC values is calculated (1116). For example, XOR 513 may calculate CRC(0,0,0,BA',ROW')⊕CRC(0,BA",COL', 0,0)⊕CRC(DQ',0,0,0,0)=CRC(DQ', BA",COL', BA', ROW'). The fourth EDC value is transmitted to the controller (1118). For example, memory component 500 may transmit the memory calculated CRC value, CRC(DQ', BA", COL', BA', ROW') to controller 400.

Figure 12:
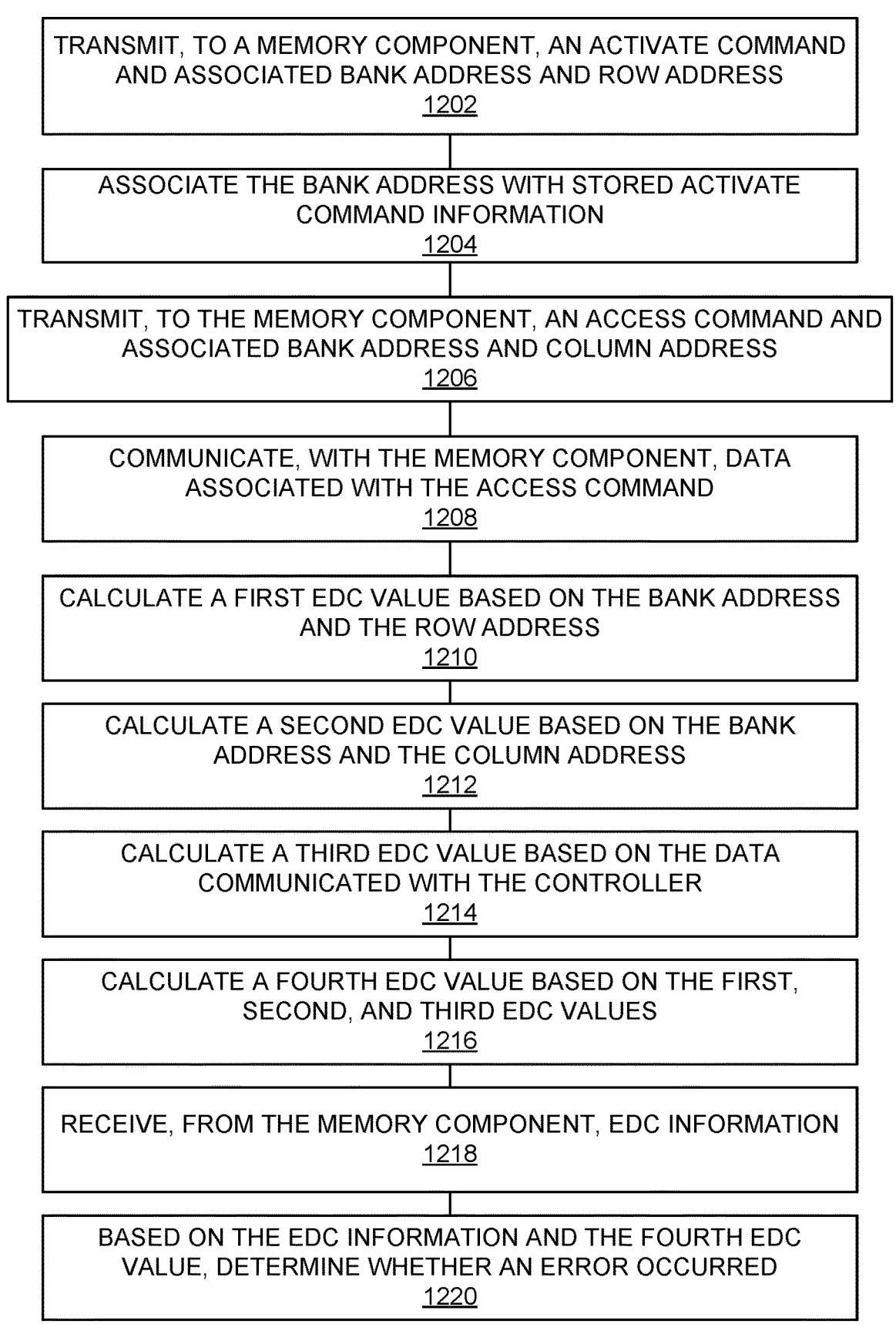
FIG. 12 is a flowchart illustrating a method of accessing a memory component.

FIG. 12 is a flowchart illustrating a method of accessing a memory component. The steps illustrated in FIG. 12 may be performed by one or more of elements of memory system 100, memory system 200, controller 400, controller 600, controller 800, and/or memory system 1000. To a memory component, an activate command and associated bank address and row address is transmitted (1202). For example, controller 400 may transmit (e.g., to memory component 500), an activate command 410 that includes bank address BA 410*a* and row address ROW 410*b*.

The bank address is associated with stored activate command information (1204). For example, controller 400 may store, in register file 411, a CRC value calculated based on at least BA value 410*a* and ROW value 410*b*. This CRC value (e.g., CRC(BA, ROW)) may be stored in an entry in register file 411 that corresponds to (e.g., is index by) bank address BA value 410*a*. In this manner, the CRC value is associated with the BA value 410*a* by virtue of the location in which the CRC value is stored in register file 411. In another example, controller 400 may store, in register file 411, the ROW value 410*b* in the entry in register file 411 that corresponds to (e.g., is index by) bank address BA value 410*a*. In another example, controller 400 may store, in register file 411, both the BA value 410*a* and the ROW value 410*b* in the entry in register file 411 that corresponds to (e.g., is index by) bank address BA value 410*a*. In the latter two examples, the CRC value (e.g., CRC(BA, ROW)) can be calculated from the stored contents at the location corresponding to BA value 410*a* in register file 411.

To the memory component, an access command and associated bank address and column address is transmitted (1206). For example, controller 400 may transmit (e.g., to memory component 500), read command 420 that includes bank address BA value 420*a* and column address COL value 420*b*. Data associated with the access command is communicated with the memory component (1208). For example, memory component 500 may communicate to controller 400 data read from memory core 526 of memory component 500. In another example, controller 400 may provide data to memory component 500 to be stored in memory core 526.

A first EDC value based on the bank address and the row address is calculated (1210). For example, EDC calculation circuitry 412 may calculate CRC(0,0,0,BA,ROW). EDC calculation circuitry 412 may calculate CRC(0,0,0,BA, ROW) based on a BA value 410*a* and/or ROW value 410*b* received from register file 411. EDC calculation circuitry 412 may calculate CRC(0,0,0,BA,ROW) based on BA value 410*a* and/or ROW value 410*b* received from other circuitry of controller 400. Controller 400 may store CRC(0,0,0,BA, ROW) in register file 411, indexed by the BA value 410*a*.

A second EDC value based on the bank address and the column address is calculated (1212). For example, EDC calculation circuitry 412 may calculate CRC(0,BA,COL,0, 0) based on BA value 420*a* and COL value 420*b* received from other circuitry of controller 400. A third EDC value is calculated based on the data communicated with the controller (1214). For example, EDC calculation circuitry 412 may calculate CRC(DQ,0,0,0,0).

A fourth EDC value based on the first, second, and third EDC values is calculated (1216). For example, XOR 413 may calculate CRC(0,0,0,BA,ROW)⊕CRC(0,BA,COL,0,0) ⊕CRC(DQ,0,0,0,0)=CRC(DQ, BA,COL, BA,ROW).

From the memory component, EDC information is received (1218). For example, controller 400 may receive, from memory component 500, the EDC value CRC(DQ', BA",COL', BA',ROW'). Based on the EDC information, and the fourth EDC value, it is determined whether an error occurred (1220). For example, XOR 413 may compare the EDC value CRC(DQ', BA",COL', BA',ROW') received from memory component 500 with the controller 400 calculated EDC value CRC(DQ, BA,COL, BA,ROW). If there is a difference between CRC(DQ', BA",COL', BA',ROW') received from memory component 500 and controller 400 calculated EDC value CRC(DQ, BA,COL, BA,ROW), it indicates that an error occurred. If there is no difference between CRC(DQ', BA",COL', BA',ROW') received from memory component 500 and controller 400 calculated EDC value CRC(DQ, BA,COL, BA,ROW), it indicates that no error(s) occurred.

Figure 13:
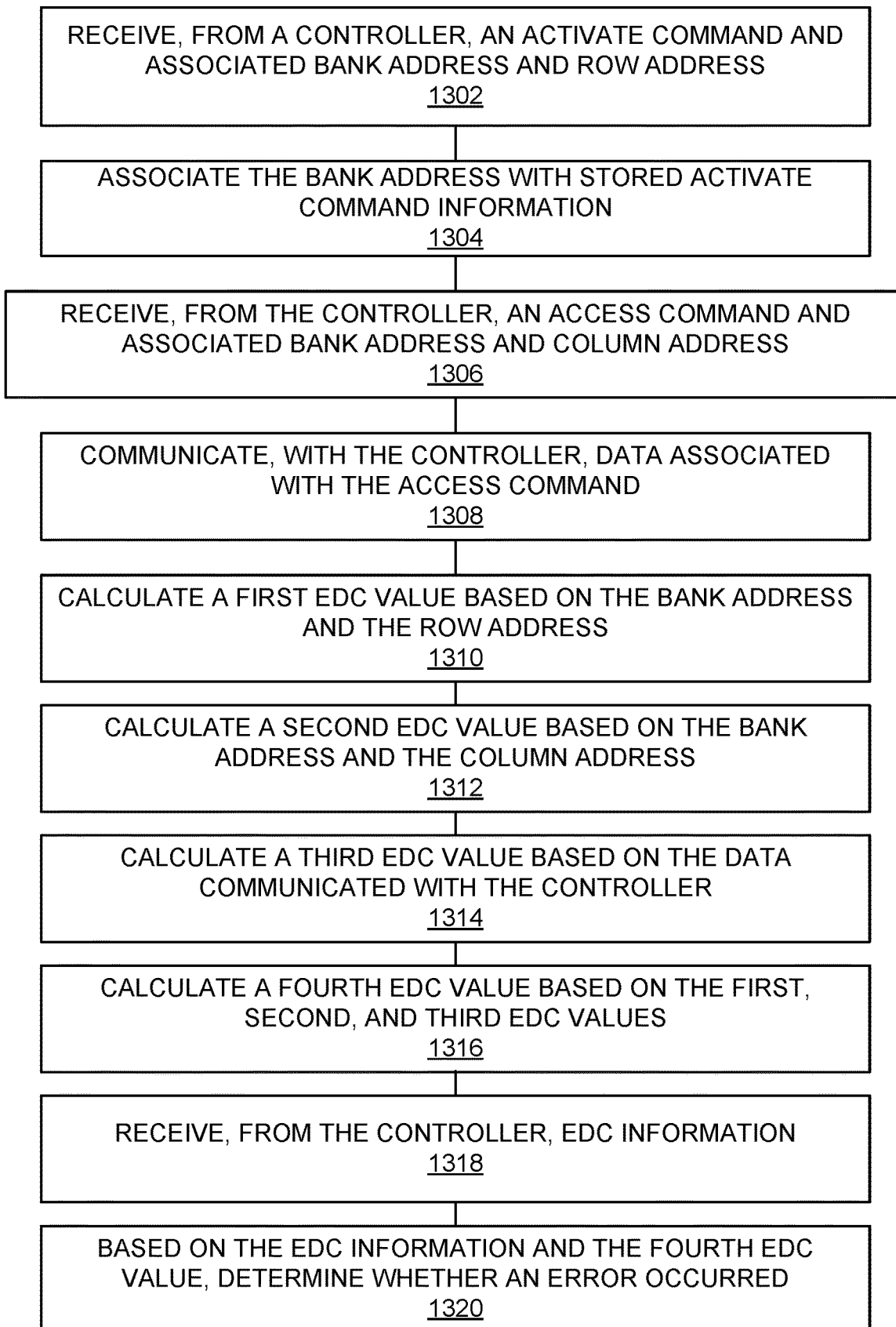
FIG. 13 is a flowchart illustrating a method of determining whether an error occurred.

FIG. 13 is a flowchart illustrating a method of determining whether an error occurred. The steps illustrated in FIG. 13 may be performed by one or more of elements of memory system 100, memory system 200, memory component 500, memory component 700, memory component 900, and/or memory system 1000. From a controller, an activate command and associated bank address and row address are received (1302). For example, memory component 900 may receive (e.g., from controller 800), activate command 910 that includes bank address BA' 910*a* and row address ROW' 910*b*.

The bank address is associated with stored activate command information (1304). For example, memory component 900 may store, in register file 911, a CRC value calculated based on at least BA' value 910*a* and ROW' value 910*b*. This CRC value (e.g., CRC(BA', ROW')) may be stored in an entry in register file 911 that corresponds to (e.g., is index by) bank address BA' value 910*a*. In this manner, the CRC value is associated with the BA' value 910*a* by virtue of the location in which the CRC value is stored in register file 911. In another example, memory component 900 may store, in register file 911, the ROW' value 910b in the entry in register file 911 that corresponds to (e.g., is index by) bank address BA' value 910a. In another example, memory component 900 may store, in register file 911, both the BA' value 910a and the ROW' value 910b in the entry in register file 911 that corresponds to (e.g., is index by) bank address BA' value 910a. In the latter two examples, the CRC value (e.g., CRC(BA', ROW')) can be calculated from the stored contents at the location corresponding to BA' value 910a in register file 911.

From the controller, an access command and associated bank address and column address are received (1306). For example, memory component 900 may receive (e.g., from controller 800), write command 920 that includes bank address BA" value 920a and column address COL' value 920b. Data associated with the access command is communicated with the controller (1308). For example, controller 800 may communicate to memory component 900 data to be written to memory core 926.

A first EDC value based on the bank address and the row address is calculated (1310). For example, EDC calculation circuitry 912 may calculate CRC(0,0,0,BA',ROW'). EDC calculation circuitry 912 may calculate CRC(0,0,0,BA',ROW') based on a BA' value 910a and/or ROW' value 910b received from register file 911. EDC calculation circuitry 912 may calculate CRC(0,0,0,BA',ROW') based on BA' value 910a and/or ROW' value 910b received from controller 800. Memory component 900 may store CRC(0,0,0,BA',ROW') in register file 911, indexed by the BA' value 910a.

A second EDC value based on the bank address and the column address is calculated (1312). For example, EDC calculation circuitry 912 may calculate CRC(0,BA",COL',0,0) based on BA" value 920a and COL' value 920b received from controller 800. A third EDC value is calculated based on the data communicated with the controller (1314). For example, EDC calculation circuitry 912 may calculate CRC(DQ',0,0,0,0).

A fourth EDC value based on the first, second, and third EDC values is calculated (1316). For example, XOR 913 may calculate CRC(0,0,0,BA',ROW')⊕CRC(0,BA",COL',0,0)⊕CRC(DQ',0,0,0,0)=CRC(DQ', BA",COL', BA', ROW').

From the memory component, EDC information is received (1318). For example, memory component 900 may receive, from controller 800, the EDC value CRC(DQ, BA,COL, BA,ROW). Based on the EDC information, and the fourth EDC value, it is determined whether an error occurred (1320). For example, XOR 913 may compare the EDC value CRC(DQ, BA,COL, BA,ROW) received from controller 800 with the memory component 900 calculated EDC value CRC(DQ', BA",COL', BA',ROW'). If there is a difference between CRC(DQ, BA,COL, BA,ROW) received from controller 800 and memory component 900 calculated EDC value CRC(DQ', BA",COL', BA',ROW'), it indicates that an error occurred. If there is no difference between CRC(DQ, BA,COL, BA,ROW) received from controller 800 and memory component 900 calculated EDC value CRC(DQ', BA",COL', BA',ROW'), it indicates that no error(s) occurred.

If an error was detected, memory component 900 may abort the write command 920 and not write the received data to memory corer 926. If an error was detected, memory component 900 may also signal controller 800 that an error occurred. If an error was detected, memory component 900 may signal controller 800 that the write command 920 was aborted. In response, controller 800 may perform a remedial action. This remedial action may include retrying write command 920.

Figure 14:
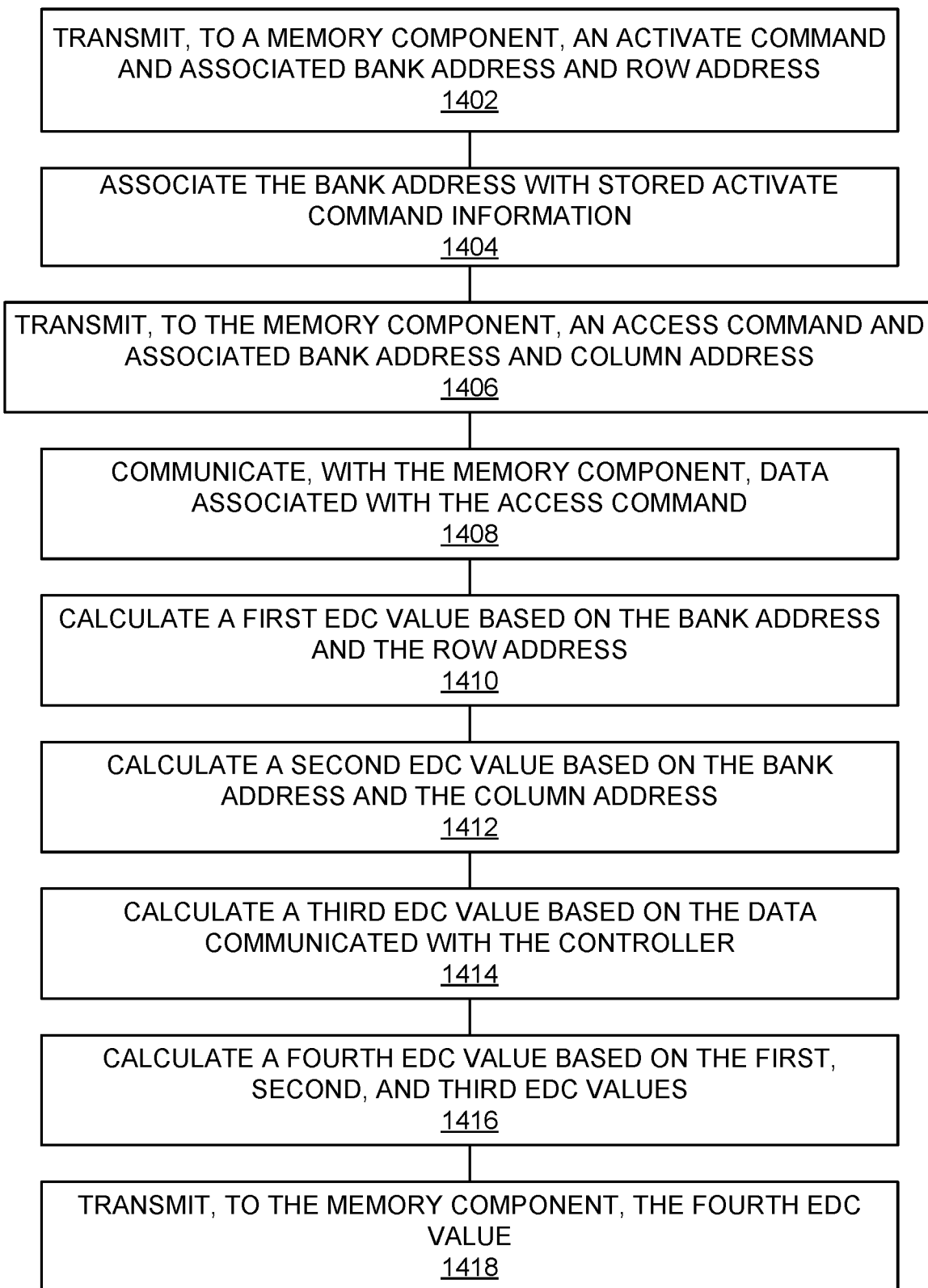
FIG. 14 is a flowchart illustrating a method of providing error-detection information.

FIG. 14 is a flowchart illustrating a method of accessing a memory component. The steps illustrated in FIG. 14 may be performed by one or more of elements of memory system 100, memory system 200, controller 400, controller 600, controller 800, and/or memory system 1000. To a memory component, an activate command and associated bank address and row address is transmitted (1402). For example, controller 800 may transmit (e.g., to memory component 900), an activate command 810 that includes bank address BA 810a and row address ROW 810b.

The bank address is associated with stored activate command information (1404). For example, controller 800 may store, in register file 811, a CRC value calculated based on at least BA value 810a and ROW value 810b. This CRC value (e.g., CRC(BA, ROW)) may be stored in an entry in register file 811 that corresponds to (e.g., is index by) bank address BA value 810a. In this manner, the CRC value is associated with the BA value 810a by virtue of the location in which the CRC value is stored in register file 811. In another example, controller 800 may store, in register file 811, the ROW value 810b in the entry in register file 811 that corresponds to (e.g., is index by) bank address BA value 810a. In another example, controller 800 may store, in register file 811, both the BA value 810a and the ROW value 810b in the entry in register file 811 that corresponds to (e.g., is index by) bank address BA value 810a. In the latter two examples, the CRC value (e.g., CRC(BA, ROW)) can be calculated from the stored contents at the location corresponding to BA value 810a in register file 811.

To the memory component, an access command and associated bank address and column address is transmitted (1406). For example, controller 800 may transmit (e.g., to memory component 900), write command 820 that includes bank address BA value 820a and column address COL value 820b. Data associated with the access command is communicated with the memory component (1408). For example, controller 800 may communicate to memory component 900 data to be written to memory core 926 of memory component 900.

A first EDC value based on the bank address and the row address is calculated (1410). For example, EDC calculation circuitry 812 may calculate CRC(0,0,0,BA,ROW). EDC calculation circuitry 812 may calculate CRC(0,0,0,BA,ROW) based on a BA value 810a and/or ROW value 810b received from register file 811. EDC calculation circuitry 812 may calculate CRC(0,0,0,BA,ROW) based on BA value 810a and/or ROW value 810b received from other circuitry of controller 800. Controller 800 may store CRC(0,0,0,BA,ROW) in register file 811, indexed by the BA value 810a.

A second EDC value based on the bank address and the column address is calculated (1412). For example, EDC calculation circuitry 812 may calculate CRC(0,BA,COL,0,0) based on BA value 820a and COL value 820b received from other circuitry of controller 800. A third EDC value is calculated based on the data communicated with the controller (1414). For example, EDC calculation circuitry 812 may calculate CRC(DQ,0,0,0,0).

A fourth EDC value based on the first, second, and third EDC values is calculated (1416). For example, XOR 813 may calculate CRC(0,0,0,BA,ROW)⊕CRC(0,BA,COL,0,0)⊕CRC(DQ,0,0,0,0)=CRC(DQ,BA,COL,BA,ROW). The fourth EDC value is transmitted to the memory component (1418). For example, controller 800 may transmit the controller calculated CRC value, CRC(DQ, BA, COL, BA, ROW) to memory component 900.

Figure 15:
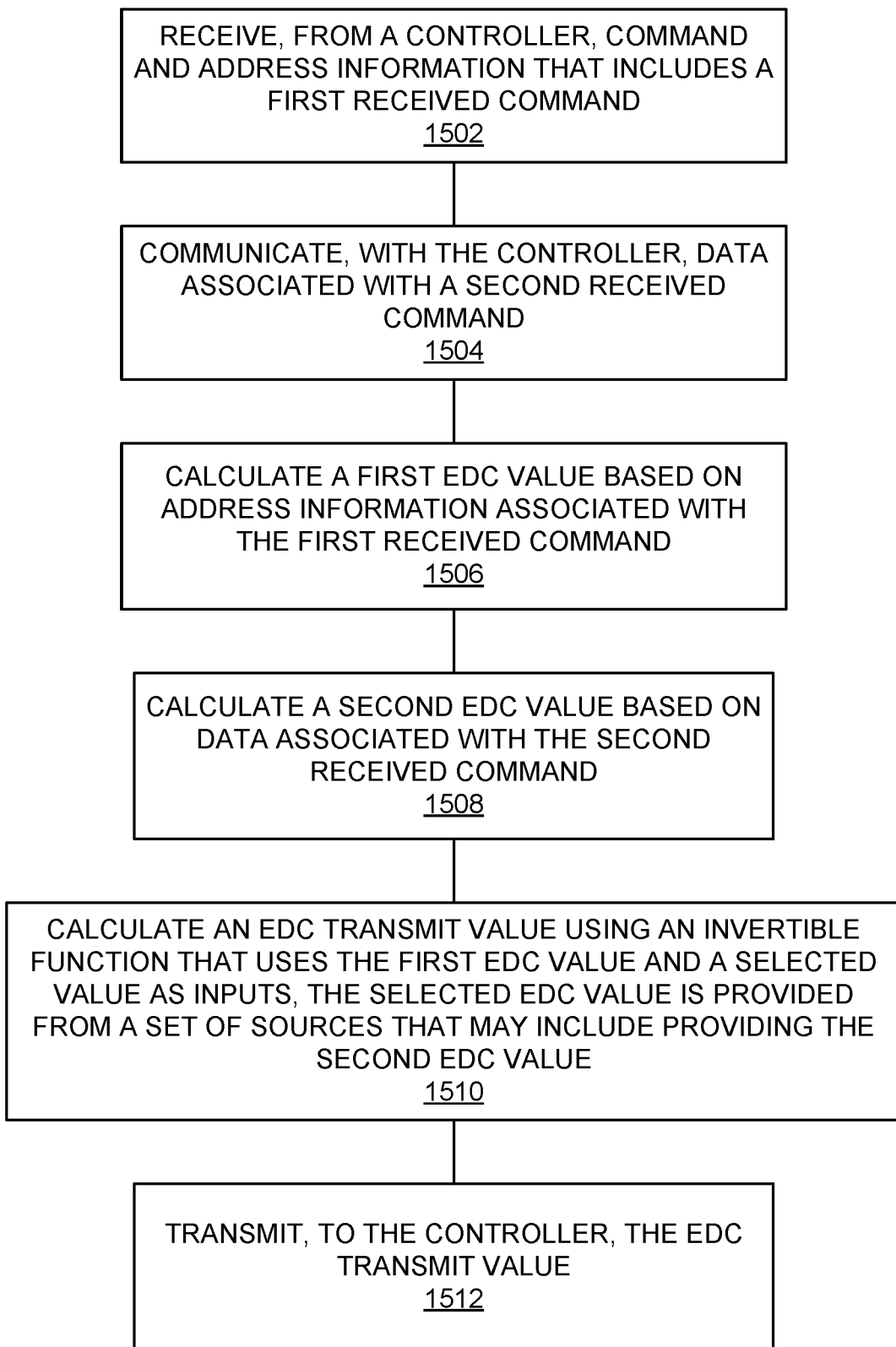
FIG. 15 is a flowchart illustrating a method of transmitting error-detection information to a controller.

FIG. 15 is a flowchart illustrating a method of transmitting error-detection information to a controller. The steps illustrated in FIG. 15 may be performed by one or more of elements of memory system 100, memory system 200, memory component 500, memory component 700, memory component 900, and/or memory system 1000. From a controller, command and address information that includes a first received command is received (1502). For example, memory component 1020 may receive, via CA interface 1031b, a first command and associated address information.

Data associated with a second received command is communicated with the controller (1504). For example, data 1025c associated with a second command (e.g., previous to the first command) may be communicated to/from memory component 1020 via DQ interface 1032b. A first EDC value is calculated based on address information associated with the first received command (1506). For example, the bank address, row address, and/or column address associated with the first received command may be input to EDC calculation circuitry 1022a to calculate a parity or CRC value (first EDC value).

A second EDC value is calculated based on data associated with the second received command (1508). For example, the data 1025c communicated to/from memory component 1020 via DQ interface 1032b may be input to EDC calculation circuitry 1022b to calculate a parity or CRC value (second EDC value). An EDC transmit value is calculated using an invertible function that uses the first EDC value and a selected value as inputs, the selected EDC value being provided from a set of sources that may include providing the second EDC value (1510). For example, MUX 1027 may select between a value provided by EDC calculation circuitry 1022b and hold value 1025b.

In an embodiment, the invertible function comprises a bitwise XOR of one or more bits of the first EDC value with a corresponding one or more bits of the second EDC value. Other invertible functions are contemplated. An invertible function has an inverse function (or anti-function). An inverse function is a function that "reverses" another function: if the function f applied to an input x gives a result of y, then applying its inverse function g toy gives the result x, and vice versa. Many types of functions are invertible.

The EDC transmit value is transmitted to the controller (1512). For example, memory component 1020 may transmit the EDC transmit value that has been "modulated" by XOR 1023 to controller 1010 via MEDC interface 1033b.

Figure 16:
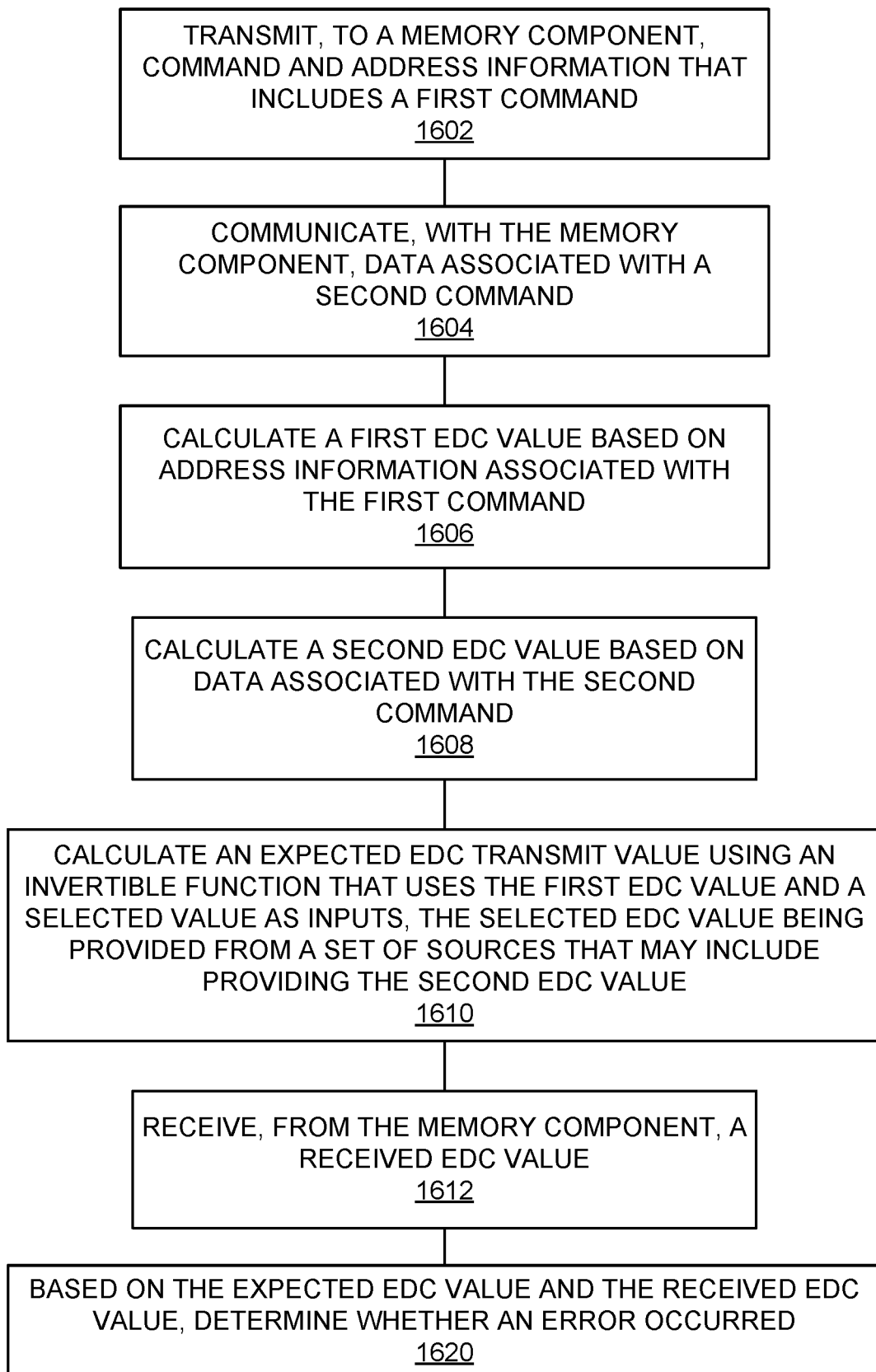
FIG. 16 is a flowchart illustrating a method of receiving error-detection information from a memory component.

FIG. 16 is a flowchart illustrating a method of receiving error-detection information from a memory component. The steps illustrated in FIG. 16 may be performed by one or more of elements of memory system 100, memory system 200, controller 400, controller 600, controller 800, and/or memory system 1000. To a memory component, command and address information that includes a first received command is transmitted (1602). For example, controller 1010 may transmit, via CA interface 1031a, a first command and associated address information.

Data associated with a second command is communicated with the memory component (1604). For example, data 1015c that is associated with a second command (e.g., previous to the first command) may be communicated to/from controller 1010 via DQ interface 1032a. A first EDC value is calculated based on address information associated with the first command (1606). For example, the bank address, row address, and/or column address associated with the first command may be input to EDC calculation circuitry 1012a to calculate a parity or CRC value (first EDC value).

A second EDC value is calculated based on data associated with the second received command (1608). For example, the data 1015c communicated to/from controller 1010 via DQ interface 1032a may be input to EDC calculation circuitry 1012b to calculate a parity or CRC value (second EDC value). An expected EDC transmit value is calculated using an invertible function that uses the first EDC value and a selected value as inputs, the selected EDC value being provided from a set of sources that may include providing the second EDC value (1610). For example, MUX 1017 may select between a value provided by EDC calculation circuitry 1012b and hold value 1015b and provide that value to XOR 1013 which will 'modulate' the selected EDC value with an invertible function that uses an EDC value from FIFO 1011 and as an input.

From the memory component, a received EDC value is received (1612). For example, controller 1010 may receive, via MEDC interface 1033a a 'modulated' EDC value from memory component 1020. Based on the expected EDC value and the received EDC value, it is determined whether an error occurred (1620). For example, XOR 1013 may compare the the received EDC value to the 'moduled' EDC value to determine whether an error occurred.

The methods, systems and devices described above may be implemented in computer systems, or stored by computer systems. The methods described above may also be stored on a non-transitory computer readable medium. Devices, circuits, and systems described herein may be implemented using computer-aided design tools available in the art, and embodied by computer-readable files containing software descriptions of such circuits. This includes, but is not limited to one or more elements of memory system 100, memory system 200, controller 400, memory component 500, controller 600, memory component 700, controller 800, memory component 900, and/or memory system 1000, and their components. These software descriptions may be: behavioral, register transfer, logic component, transistor, and layout geometry-level descriptions. Moreover, the software descriptions may be stored on storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, and so on.

Figure 17:
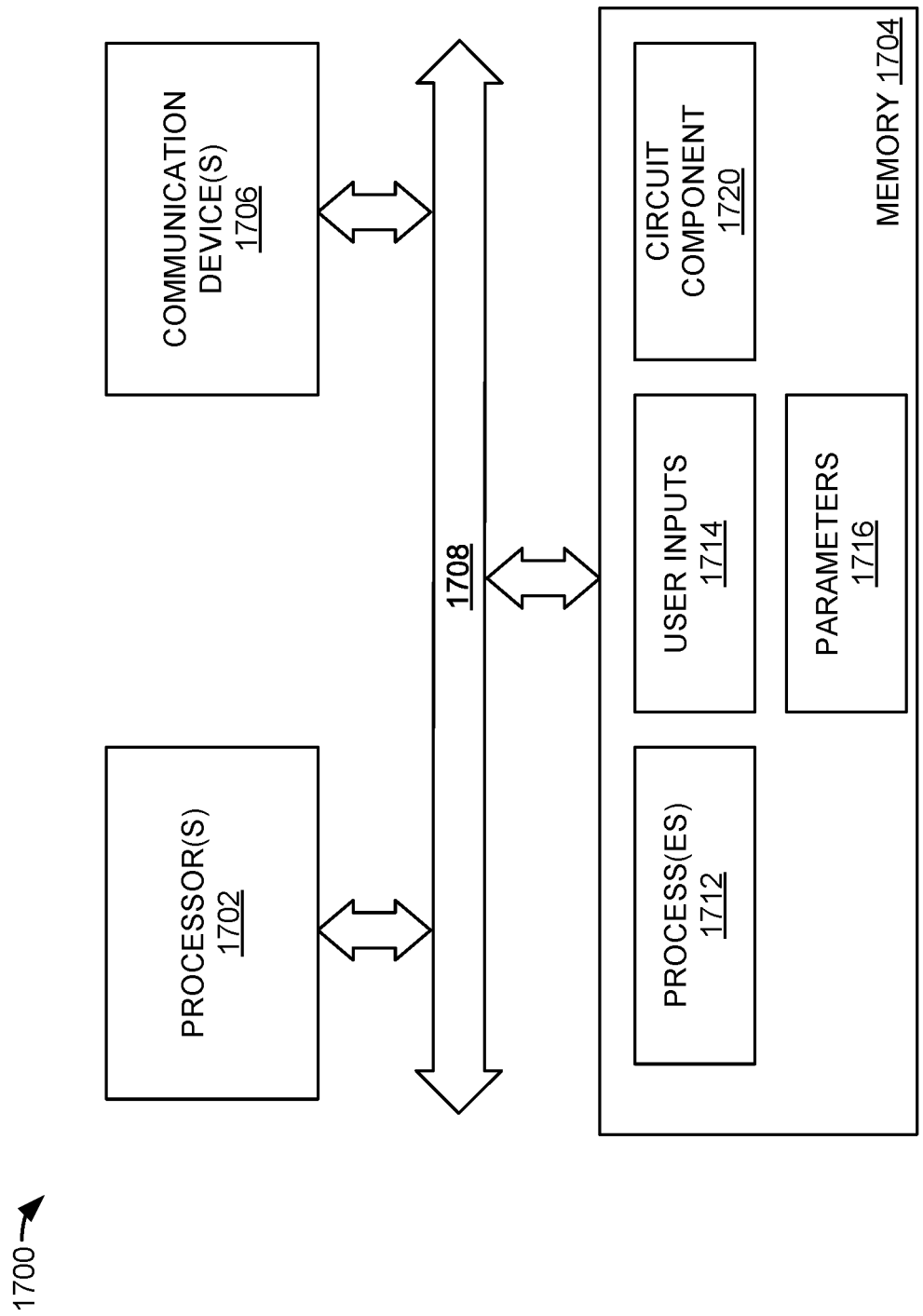
FIG. 17 is a block diagram of a processing system.

FIG. 17 is a block diagram illustrating one embodiment of a processing system 1700 for including, processing, or generating, a representation of a circuit component 1720. Processing system 1700 includes one or more processors 1702, a memory 1704, and one or more communications devices 1706. Processors 1702, memory 1704, and communications devices 1706 communicate using any suitable type, number, and/or configuration of wired and/or wireless connections 1708.

Processors 1702 execute instructions of one or more processes 1712 stored in a memory 1704 to process and/or generate circuit component 1720 responsive to user inputs 1714 and parameters 1716. Processes 1712 may be any suitable electronic design automation (EDA) tool or portion thereof used to design, simulate, analyze, and/or verify electronic circuitry and/or generate photomasks for electronic circuitry. Representation 1720 includes data that describes all or portions of memory system 100, memory system 200, controller 400, memory component 500, controller 600, memory component 700, controller 800, memory component 900, and/or memory system 1000, and their components, as shown in the Figures.

Representation 1720 may include one or more of behavioral, register transfer, logic component, transistor, and layout geometry-level descriptions. Moreover, representation 1720 may be stored on storage media or communicated by carrier waves.

Data formats in which representation 1720 may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email User inputs 1714 may comprise input parameters from a keyboard, mouse, voice recognition interface, microphone and speakers, graphical display, touch screen, or other type of user interface device. This user interface may be distributed among multiple interface devices. Parameters 1716 may include specifications and/or characteristics that are input to help define representation 1720. For example, parameters 1716 may include information that defines device types (e.g., NFET, PFET, etc.), topology (e.g., block diagrams, circuit descriptions, schematics, etc.), and/or device descriptions (e.g., device properties, device dimensions, power supply voltages, simulation temperatures, simulation models, etc.).

Memory 1704 includes any suitable type, number, and/or configuration of non-transitory computer-readable storage media that stores processes 1712, user inputs 1714, parameters 1716, and circuit component 1720.

Communications devices 1706 include any suitable type, number, and/or configuration of wired and/or wireless devices that transmit information from processing system 1700 to another processing or storage system (not shown) and/or receive information from another processing or storage system (not shown). For example, communications devices 1706 may transmit circuit component 1720 to another system. Communications devices 1706 may receive processes 1712, user inputs 1714, parameters 1716, and/or circuit component 1720 and cause processes 1712, user inputs 1714, parameters 1716, and/or circuit component 1720 to be stored in memory 1704.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A controller, comprising:
a first interface to transmit, to a memory component, an activate command, an access command, and associated address information, the activate command associated with a first bank address value and a row address value, the access command associated with a second bank address value and a column address value;
a second interface to communicate, with the memory component, data associated with the access command;
error detection code (EDC) calculation circuitry to calculate a first EDC value based on the first bank address value and the row address value, and to calculate a second EDC value based on the second bank address value and the column address value, and to calculate a third EDC value based on data communicated via the second interface;
circuitry to associate the second bank address value with stored activate command information, the stored activate command information to be based on the row address;
code combination circuitry to calculate a fourth EDC value based on the first EDC value, the second EDC value, and the third EDC value;
a third interface to receive, from the memory component, error detection information; and
circuitry to, based on the error detection information and the fourth EDC value, determine whether an error occurred.

2. The controller of claim 1, wherein the stored activate command information includes the first EDC value.

3. The controller of claim 1, wherein the stored activate command information includes the row address value.

4. The controller of claim 1, wherein, based at least in part on the memory component being in a first mode, the error detection information is to include the fourth EDC value, and based at least in part on the memory component being in a second mode, the error detection information is to include the third EDC value.

5. The controller of claim 1, wherein the access command corresponds to a read operation and the data communicated via the second interface is to be retrieved from a bank of the memory component and is to be transmitted to the controller.

6. The controller of claim 1, wherein the access command corresponds to a write operation and the data communicated via the second interface is to be transmitted from the controller and stored in a bank of the memory component.

7. The controller of claim 1, wherein the EDC calculation circuitry generates EDC values based on an EDC encoding scheme that is a linear function.

8. A controller, comprising:
a first interface to transmit, to a memory component, an activate command, a write command, and associated address information, the activate command associated with a first bank address value and a row address value, the write command associated with a second bank address value and a column address value;
a second interface to transmit, to the memory component, data associated with the write command;
error detection code (EDC) calculation circuitry to calculate a first EDC value based on the first bank address value and the row address value, and to calculate a second EDC value based on the second bank address value and the column address value, and to calculate a third EDC value based on the data associated with the write command;

circuitry to associate the second bank address value with stored activate command information, the stored activate command information to be based on the row address value;

code combination circuitry to calculate a fourth EDC value based on the first EDC value, the second EDC value, and the third EDC value;

a third interface to receive, from the memory component, error detection information corresponding to the write command; and error detection circuitry to, based on the fourth EDC value and the error detection information received from the memory component, determine whether an error has occurred.

9. The controller of claim 8, wherein the stored activate command information includes the first EDC value.

10. The controller of claim 8, wherein the stored activate command information includes the row address value.

11. The controller of claim 8, wherein, based at least in part on the memory component being in a first mode, the third interface is to transmit, to the memory component, the error detection information corresponding to the write command, and based at least in part on the memory component being in a second mode, the third interface is to receive error detection information calculated by the memory component, the error detection information calculated by the memory component to include the third EDC value.

12. The controller of claim 8, further comprising:

a fourth interface to receive, from the memory component, an indicator of whether the error has occurred.

13. The controller of claim 8, wherein if the error detection circuitry determines that an error has occurred, the data associated with the write command is not stored in a bank of the memory component.

14. The controller of claim 8, further comprising:

a fourth interface to receive, from the memory component, an indicator that an error has occurred.

15. The controller of claim 8, wherein the memory component includes a storage element to, if the error detection circuitry determines that an error has occurred, store error information, the error information comprising at least one of the second bank address, the row address, and the column address.

16. A controller, comprising:

a first interface to transmit, to a memory component, a first command, a second command, and associated address information;

a second interface to communicate, with the memory component, data associated with the second received command;

error detection code (EDC) calculation circuitry to calculate a first EDC value based on the first command, and to calculate a second EDC value based on data communicated via the second interface;

code modulation circuitry to calculate an expected EDC transmit value using an invertible function that is based on the first EDC value and a selected value, the selected EDC value to be provided by a source from a set of sources that include the EDC calculation circuitry providing the second EDC value;

a third interface to receive, from the memory component, a received EDC value; and circuitry to, based on the expected EDC value and the received EDC value, determine whether an error occurred.

17. The controller of claim 16, wherein the first command and the second command communicate data via second interface during different time allocations.

18. The controller of claim 16, wherein the invertible function comprises a bitwise exclusive-OR of at least one bit of the first EDC value with at least one bit of the selected value.

19. The controller of claim 16, wherein the set of sources include a register that provides a hold value.

20. The controller of claim 19 wherein the hold value is selected for commands that are not associated with data communicated via the second interface.

* * * * *